(12) United States Patent
Takagi et al.

(10) Patent No.: US 6,282,680 B1
(45) Date of Patent: Aug. 28, 2001

(54) SEMICONDUCTOR DEVICE

(75) Inventors: Ryoichi Takagi; Katsushi Asahina, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/217,593

(22) Filed: Dec. 21, 1998

(30) Foreign Application Priority Data

Jun. 22, 1998 (JP) .................................................. 10-174650

(51) Int. Cl.[7] .................................................. G01R 31/28
(52) U.S. Cl. .................................................. 714/724
(58) Field of Search .................................... 714/733, 734, 714/724, 726, 819, 728; 324/765, 763

(56) References Cited

U.S. PATENT DOCUMENTS

| 5,479,127 | * | 12/1995 | Bui | 327/174 |
| 5,487,074 | * | 1/1996 | Sullivan | 714/727 |
| 5,621,739 | | 4/1997 | Sine et al. | 714/724 |
| 5,831,994 | * | 11/1998 | Takino | 714/736 |

* cited by examiner

Primary Examiner—Christine T. Tu
(74) Attorney, Agent, or Firm—Oblon, Spivak, McClelland, Maier & Neustadt, P.C.

(57) ABSTRACT

Provided is a semiconductor device having an I/O buffer cell capable of performing a timing verification test of high accuracy. A phase comparator (2) compares the phase of data (DATA) and that of a clock (CLK) and outputs a phase comparison result to a first input of an MUX (3). A test mode signal (STM1) inputted from a test mode terminal (14) is provided to the control input of the MUX (3) through a test mode input section (4). The MUX (3) receives at its second input the output signal of an internal logic (50) through a signal input section (9) and, based on the test mode signal (STM1), outputs either the phase comparison result or the output signal of the internal logic (50), to the input section of a driver (8).

15 Claims, 15 Drawing Sheets

SEMICONDUCTOR DEVICE

BACKGROUND OF THE INVENTION

1. Field of the Invention

The present invention relates to a circuit configuration of an internal input/output (I/O) buffer which permits a timing verification test of high accuracy for semiconductor devices (hereinafter referred to as "LSI" in some cases).

2. Description of the Background Art

FIG. 19 shows a conventional configuration in which a test of an LSI is carried out with a semiconductor testing apparatus (hereinafter referred to as "LSI tester" in some cases).

An LSI tester 500 comprises a tester body 504 and a test head 506. The tester body 504 has a timing generator 501 for generating timing signals needed as LSI test conditions, a waveform formatter 502 for determining waveforms of the rise and fall timings and the like, and a power supply and DC measuring unit 503 comprising a power supply for driving a device and a section for measuring DC of a device. The test head 506 performs direct giving and receiving of signals between an LSI under test 505, based on a control signal obtained through a cable 507 from the tester body 504.

When conducting a test of the LSI under test 505, a test signal is generated from a tester driver 509 of pin electronics which is housed in the test head 506, and the test signal is applied to the LSI under test 505 through POGO pins 510, a wire 512 of a DUT board 511, an electrode 514 of a socket 513, and a wire 516 of an LSI package 515. Conversely, a reaction signal obtained after the LSI 505 operates is transferred to a tester comparator 517 of the LSI tester 500 through a similar path. The tester comparator 517 then compares the reaction signal with an expected value EXP, so that the LSI tester 500 judges whether or not the LSI 505 is operating in conformity with design.

Where the LSI 505 is tested with the LSI tester 500 as described, the following problems have caused in conducting one of test items, a timing verification test. With increasing the operation speed of the LSI 505, the interface of the LSI 505 is required to operate in a clock of several hundreds MHz grade, and thus the product specification of the LSI 505, e.g., the setup and hold timing value, becomes extremely small, which causes difficulties in carrying out an accurate timing verification test with the LSI tester 500 under severe timing conditions.

One concrete example will be described with reference to FIGS. 20 and 21. FIG. 20 shows the configuration of a conventional I/O buffer cell 520. FIG. 21 shows a timing relationship between a data terminal 521 and a clock terminal 522 when a timing verification test is conducted.

Referring to FIG. 20, a clock CLK obtained from the clock terminal 522 is provided to the control inputs of a driver 524 and a receiver 525 through a clock input section 611. The operations of the driver 524 and the receiver 525 are controlled by the clock CLK.

Data DATA obtained from the data terminal 521 is provided to a first input of the receiver 525 through a data I/O section 612, and a reference voltage $V_{REF}$ is provided to a second input of the receiver 525 through a reference voltage input section 607. The receiver 525 compares the data DATA and the reference voltage $V_{REF}$ and outputs an internal signal which is obtained by buffering based on its comparison result, to an internal logic 523 through a signal output section 610.

The output from the internal logic 523 is taken as the input to the driver 524, through a signal input section 609. The output of the driver 525 is outputted to the data terminal 521 through the data I/O section 612.

For example, assuming that the product standard of the setup timing of data DATA against the clock CLK of the I/O buffer cell 520 mounted on the LSI under test 505, is 0.2 ns, it will be discussed the case where a timing verification test of whether the I/O buffer cell 520 in the LSI 505 satisfies the timing condition, i.e., the setup time of 0.2 ns, is carried out with the LSI tester 500.

Even where a timing verification test at a setup TS0 is conducted when the waveform of data DATA is L1 and that of a clock CLK is L3 in FIG. 21, the fact is that a skew α a causes in both the data DATA and clock CLK Therefore, if the phase of the data DATA is advanced like waveform L2, and the phase of the clock CLK is delayed like waveform L4, the timing verification test might be conducted at a setup time TS2 significantly greater than a preset setup time TS1.

Specifically, provided that a variation in signal propagation time due to a timing skew of signals generated by the LSI tester 500 is ±0.15 ns, a variation in signal propagation time due to the lengths of the wire 512 of the DUT board 511 and the electrode 514 of the socket 513 is ±0.05 ns, and a variation in signal propagation time due to the length of the wire 516 of the package 515 is ±0.1 ns, the maximum phase difference in signal between the clock CLK and the data DATA is 0.6 ns.

Accordingly, even when the clock CLK has a phase lag of 0.6 ns as compared to the data DATA, a test program value should be set to −0.4 ns (the phase of the clock CLK is 0.4 ns ahead the data DATA) in order to positively assure the setup of the product standard, i.e., 0.2 ns. This is because when a test program value tp is set to a value greater than −0.4 ns, if the clock CLK has a phase lag of 0.6 ns as compared to the data DATA, a timing verification test might be conducted at a setup time greater than 0.2 (tp+0.6), thereby causing the danger that the LSI under test 505 not satisfying the setup time of 0.2 ns is erroneously judged good.

Even though the test program value tp is set to −0.4 ns, however, there is the possibility that since a timing skew in the LSI tester 500 still exists, it results in −1.0 ns when the worst happens in an actual timing applied to the LSI 505 (i.e., the case where the data DATA has a phase lag of 0.6 ns as compared to the clock CLK).

When the above worst timing is applied to the LSI 505, the great majority of the LSI 505 are judged poor, originally to be judged good. This leads to excessive drop in the yield of the LSI 505.

SUMMARY OF THE INVENTION

According to a first aspect of the present invention, a semiconductor device having an I/O buffer cell that receives first and second input signals and performs buffering of the first input signal to output an internal input signal to an internal circuit, is characterized in that the I/O buffer cell includes: a phase comparing means for comparing a phase difference between the first input signal and the second input signal to output a phase comparison result; and an internal signal outputting means that performs buffering of the first input signal to output the internal input signal, the operational control of the internal signal outputting means being controlled based on the second input signal.

According to a second aspect, the semiconductor device of the first aspect is characterized in that the I/O buffer cell further includes: an external signal selecting means that receives a test mode signal for external signal, an internal output signal from the internal circuit, and the phase comparison result and, based on the test mode signal for external signal, outputs one of the phase comparison result and the internal output signal, as a selection signal for external output; and an external signal outputting means that performs buffering of the selection signal for external output to output an external output signal, the operation control of the external signal outputting means being controlled based on the second input signal.

According to a third aspect, the semiconductor device of the first aspect is characterized in that: the second input signal contains an out-of cell input signal and a clock; and the I/O buffer cell further includes a selection means for phase comparison that receives a test mode signal for phase comparison and, based on the test mode signal for phase comparison, outputs one of the out-of cell input signal and the clock to the phase comparing means.

According to a fourth aspect, the semiconductor device of the third aspect is characterized in that the first input signal contains a plurality of first input signals, and the I/O buffer cell contains a plurality of I/O buffer cells provided so as to correspond to the plurality of first input signals respectively. This semiconductor device is further characterized in that: each I/O buffer cell in the plurality of I/O buffer cells has the phase comparing means, the selection means for external signal, the selection means for phase comparison and the internal signal outputting means, receives the corresponding one of the plurality of first input signals, and is capable of outputting the corresponding first input signal as a cell output signal; and the plurality of I/O buffer cells are arranged in a predetermined order and receive the cell output signal of the I/O buffer cell of ante-stage as the out-of cell input signal.

According to a fifth aspect, the semiconductor device of the first aspect is characterized in that the phase comparing means has: a logical gate that logically compares a match/mismatch between the value of the first signal and the value of the second input signal to output a logical output signal; and a phase comparison result outputting means that outputs the logical output signal as the phase comparison result, during a predetermined sampling period.

According to a sixth aspect, the semiconductor device of the fifth aspect is characterized in that the phase comparison result outputting means includes a sampling period detecting means that detects a period in the vicinity of a predetermined edge change of the second input signal as the sampling period, based on the second input signal.

According to a seventh aspect, the semiconductor device of the first aspect further includes a phase comparison result outputting terminal capable of externally outputting the phase comparison result.

According to an eighth aspect, the semiconductor device of the seventh aspect is characterized in that the phase comparing means includes: a logical gate that logically compares a match/mismatch between the value of the first signal and the value of the second input signal to output a logical output signal; a sampling period detecting means that detects, as a sampling period, a period in the vicinity of a predetermined edge change of the second input signal, based on the second input signal; a sampling means that latches, as a latch signal, a signal value of the logical output signal taken during the predetermined sampling period; and a current quantity adjusting means that is placed on a signal path between a predetermined node and a fixed potential and, when supplying current to the predetermined node, changes the quantity of current flowing through the predetermined node, based on the latch signal. This semiconductor device is further characterized in that: the phase comparison result outputting terminal contains the predetermined node, and the phase comparison result contains the current flowing through the predetermined node.

According to a ninth aspect, the semiconductor device of the eighth aspect is characterized in that the phase comparing means includes: a logical gate that logically compares a match/mismatch between the value of the first signal and the value of the second input signal to output a logical output signal; a sampling period detecting means that detects a period in the vicinity of a predetermined edge change of the second input signal as a sampling period, based on the second input signal; a sampling means that latches, as a latch signal, a signal value of the logical output signal taken during the predetermined sampling period; and a counter that receives the latch signal and counts the number of a predetermined edge change of the latch signal to obtain a count result.

According to a tenth aspect, the semiconductor device of the ninth aspect is characterized in that the count result contains a count value of a predetermined number of bits; and the phase comparing means further includes a shift circuit capable of latching the count value and serially outputting the count value to the phase comparison result outputting terminal.

According to an eleventh aspect, the semiconductor device of the ninth aspect is characterized in that: the count result contains a count value of a predetermined number of bits; the phase comparison result outputting terminal contains a predetermined number of output terminals corresponding to the count value of the predetermined number of bits. This semiconductor device further comprises an output signal selecting means that receives the count value of the predetermined number of bits, externally outputs the count value from the predetermined number of output terminals when set in a first condition, and outputs another signal from the predetermined number of output terminals when set in a second condition.

According to a twelfth aspect, a semiconductor device having an I/O buffer cell that receives first and second input signals and a test mode signal, and performs buffering of the first input signal to output an internal input signal to an internal circuit, is characterized in that the I/O buffer cell comprises: an internal signal outputting means that performs buffering of a signal received at an input section by using a predetermined edge change of the first control signal, as a trigger, to output the internal input signal, and latches the internal input signal, the operation of the internal signal outputting means being controlled based on a first control signal; an external signal outputting means that performs buffering of a signal received at an input section by using the predetermined edge change of the second control signal, as a trigger, to output an external output signal, and latches the external output input signal, the operation of the external signal outputting means being controlled based on a second control signal; a first transferring means being caused to be conducting/disconducting based on a third control signal, disposed on a signal path between an output section of the internal signal outputting means and the input section of the external signal outputting means; a second transferring means being caused to be conducting/disconducting based on a fourth control signal, disposed on a signal path between an output section of the external signal outputting means and the input section of the internal signal inputting means; and a control signal setting means that receives a test mode signal and the second input signal and, when the test mode signal indicates a phase comparison mode, sets the first control signal to the second input signal, the second control signal to a signal obtained by logically inverting the second input signal, the third control signal to a signal that indicates a conducting state with a first delay time from the predetermined edge change of the second input signal, and the fourth control signal to a signal that indicates a conducting state with a second delay time from the predetermined edge change of the second input signal, respectively, the second delay time being set to be greater than the first delay time.

The I/O buffer cell in the semiconductor device of the first aspect has the phase comparing means that compares a phase difference between the first and second input signals to output a phase comparison result.

It is therefore able to recognize a reference timing between the first and second input signals in the I/O buffer cell by providing the first and second input signals from externally while changing the timing condition therebetween, and then monitoring the phase comparison result.

Thus, by providing the first and second input signals under a predetermined timing condition based on the reference timing, it is possible to perform a timing verification test of high accuracy without depending upon the existence of timing skews in the first and second input signals which may occur when these signals are outputted with a tester or the like.

The I/O buffer cell in the semiconductor device of the second aspect has the selection means for external signal that outputs either a phase comparison result or an internal output signal as a selection signal for external output, based on a test mode signal for external signal; and the external signal outputting means that performs buffering of the selection signal for external output to output an external output signal.

It is therefore possible to output externally a phase comparison result as an external output signal to be outputted from the external signal outputting means by providing a test mode signal for external signal indicating the selection of the phase comparison result.

The I/O buffer cell in the semiconductor device of the third aspect further includes the second signal selecting means that outputs either an out-of cell input signal or a clock to the phase comparing means, based on the second test mode signal.

Thus, either the reference timing between the first input signal and the out-of cell input signal or the reference timing between the first input signal and the clock in the I/O buffer cell, can be selectively recognized by monitoring the phase comparison result.

The I/O buffer cell in the semiconductor device of the fourth aspect comprises a plurality of I/O buffer cells which are provided so as to correspond to a plurality of first input signals and are arranged in a predetermined order. These I/O buffer cells receive the cell output signal of their respective I/O buffer cell of ante-stage, as an out-of cell input signal.

Thus, by monitoring the phase comparison result of one of the plurality of I/O buffer cells, it is possible to recognize selectively either the reference timing between the first input signal and the out-of cell input signal from its I/O buffer cell of ante-stage or the reference timing between the first input signal and the clock in the monitored I/O buffer cell.

The phase comparison means of the I/O buffer cell in the semiconductor device of the fifth aspect has the logical gate that logically compares a match/mismatch between the value of the first input signal and the value of the second input signal to output a logical output signal; and the phase comparison result outputting means that outputs a signal obtained based on the logical output signal as a phase comparison result, during a predetermined sampling period.

Thus, the phase relationship between the first and second input signals in the I/O buffer cell can be recognized depending on whether the logical value of a phase comparison result indicates "match" or "mismatch." In addition, a phase comparison result can be outputted only by the logical gate and phase comparison result outputting means, resulting in a relatively simple circuit configuration.

The sampling period detecting means of the phase comparison result outputting means of the I/O buffer cell in the semiconductor device of the sixth aspect detects, based on the second input signal, a period in the vicinity of a predetermined edge change of the second input signal as a predetermined sampling period. Accordingly, even for a complicated phase relationship between the first and second input signals, it is possible to output a phase comparison result assuredly judging a match/mismatch between the first and second input signals.

The semiconductor device of the seventh aspect further includes the phase comparison result outputting terminal capable of outputting externally a phase comparison result. Thus, a phase comparison result is always recognizable from the phase comparison result outputting terminal.

The current quantity adjusting means of the phase comparison result outputting means in the semiconductor device of the eighth aspect is placed on a signal path between a fixed potential and a predetermined node being a phase comparison result outputting terminal, and changes a phase comparison result, which is the current quantity flowing through a predetermined node when providing current to a predetermined node, based on the latch signal sampled by the sampling means.

This leads to a phase comparison result reflecting the period the logical value of a latch signal indicates "match".

In addition, the sampling period detecting means detects, based on the second input signal, a period in the vicinity of a predetermined edge change of the second input signal, as a predetermined sampling period. Accordingly, even for a complicated phase relationship between the first and second input signals, it is possible to output a phase comparison result assuredly judging a match/mismatch between the first and second input signals.

The counter of the phase comparison result outputting means in the semiconductor device of the ninth aspect obtains a count result by counting the number of a predetermined edge change of a latch signal. Therefore, by detecting whether the count result obtained from the counter is N or below N, when the first test mode signal indicating a phase comparison mode is provided and the first and second input signals are inputted at a predetermined timing condition while inputting a clock as a second signal, during N-cycle period, it is possible to recognize precisely a phase match/mismatch between the first and second signals even when the first and second signals contain a jitter component.

The counter of the phase comparing means in the semiconductor device of the tenth aspect can latch the count value of a predetermined number of bits to output this count value to the phase comparison result outputting terminal per bit. Thus, it is possible to output the count result of the predetermined number of bits only by adding one phase comparison result outputting terminal as an external output terminal.

The output signal selecting means of the phase comparison result outputting means in the semiconductor device of the eleventh aspect can receive the count value of a predetermined number of bits and, when setting the first condition, can output this count value externally from a predetermined number of output terminals serving as the phase comparison result outputting terminal, by batch processing. As a result, the count result in the counter can be quickly outputted externally.

In addition, it is possible to output another signal from the predetermined number of output terminals when setting the second condition. Hence, the number of output terminals can be minimized by an efficient use of a number of output terminals.

The control signal setting means in the semiconductor device of the twelfth aspect sets, when a test mode signal indicates a phase comparison mode, the first control signal to the second input signal, the second control signal to a signal obtained by logically inverting the second input signal, the third control signal to a signal that indicates the active state with the first delay time from a predetermined edge change of the second input signal, and the fourth control signal to a signal that indicates the active state with the second delay time (being greater than the first delay time) from a predetermined edge change of the second input signal, respectively.

Therefore, a test mode signal indicating a phase comparison mode is provided and the first and second input signals are provided so as to obtain a timing at which the value of the first input signal changes from the first value to the second value at the time of a predetermined edge change of the second signal, thereby causing the external signal outputting means having the latching function to latch data. In this case, since the second delay time is set to be greater than the first delay time, there is no possibility that an erroneous signal is provided to the input section of the internal signal outputting means.

Then, a test mode signal indicating normal mode is provided and the data latched with the external signal outputting means is monitored as an external output signal. This enables to recognize a phase advance/lag between the first and second input signals in the I/O buffer cell.

Specifically, the phase of the second input signal leading the phase of the first input signal is recognized when the external output signal has the first value during the monitoring, and the phase of the second input signal lagging the phase of the first input signal is recognized when the external output signal has the second value.

Thus, by recognizing the reference timing between the first and second input signals in the I/O buffer cell and providing the first and second input signals under a predetermined timing condition based on the reference timing, it is possible to perform a timing verification test of high accuracy without depending upon the existence of timing skews in the first and second input signals which may occur when these signals are outputted with a tester or the like.

Furthermore, the semiconductor device may eliminate the need to provide particular phase comparator means for recognition of the phase lead/lag between the first and second input signals, to provide an accordingly simplified circuit configuration.

It is an object of the present invention to obtain a semiconductor device with an I/O buffer cell permitting a timing verification test of high accuracy which is independent of the timing skew of a tester or the variations in transmission lines such as a DUT board.

These and other objects, features, aspects and advantages of the present invention will become more apparent from the following detailed description of the present invention when taken in conjunction with the accompanying drawings.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

First Preferred Embodiment

Figure 1:
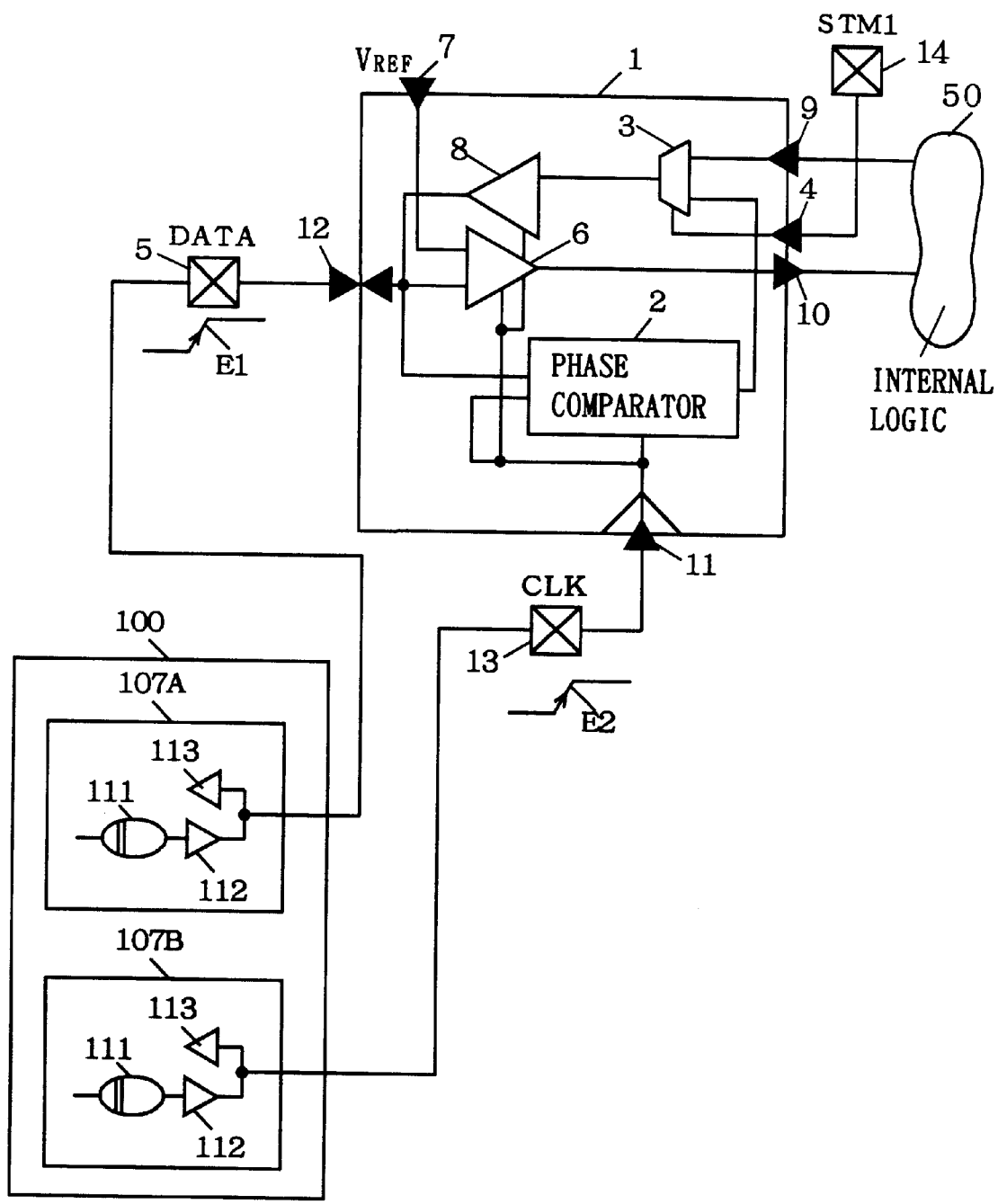
FIG. 1 is a circuit diagram of the internal configuration of an I/O buffer cell of an LSI according to a first preferred embodiment of the present invention.

Referring now to the drawings, wherein like reference numerals designate identical or corresponding parts throughout the several views, and more particularly to FIGS. 1–18 thereof, there are illustrated exemplary embodiments of the present invention.

FIG. 1 is a circuit diagram of the configuration of an I/O buffer cell of an LSI according to a first preferred embodiment of the present invention.

An I/O buffer cell 1 is capable of giving and receiving of signals through a data terminal 5, a clock terminal 13 and a test mode terminal 14, respectively, which are all external to the cell 1. These terminals 5, 13 and 14 are provided as a bonding pad or package terminal.

A clock CLK inputted from the clock terminal 13 is provided to a first input of a phase comparator 2 through a clock input section 11, and also provided to the control inputs of a receiver 6 and a driver 8. As shown in FIG. 1, the clock CLK is further provided to the phase comparator 2 in some cases, thereby generating a clock TGCLK for setting a sampling period as described later. The data DATA inputted from the data terminal 5 is provided to a second input of the phase comparator 2 through a data I/O section 12, and is also provided to a first input of the receiver 6.

The phase comparator 2 compares the phase of the data DATA and that of the clock CLK to output a phase comparison result to a first input of an MUX (multiplexer) 3. A test mode signal STM1 inputted from the test mode terminal 14 is provided to the control input of the MUX 3 through a test mode input section 4. The MUX 3 receives at its second input the output signal of an internal logic 50 through a signal input section 9 and, based on the test mode signal STM1, outputs either the phase comparison result or the output signal of the internal logic 50, to the input section of the driver 8.

The operations of the receiver 6 and the driver 8 are controlled based on the signals obtained from their respective control inputs. The receiver 6 receives at its second input a reference voltage $V_{REF}$ through a reference voltage input section 7. The reference voltage $V_{REF}$ may be applied from externally, alternatively, may be caused to generate in the interior of an LSI. Then, the receiver 6 compares the data DATA and the reference voltage $V_{REF}$ and performs buffering based on its comparison result to output an internal signal (which is given to/received from the internal circuit of the LSD) to the internal logic 50 through a signal output section 10.

The driver 8 drives the output signal of the MUX 3 and then outputs it as an external output signal, from the data terminal 5 through the data I/O section 12.

The data DATA and clock CLK are both signals outputted from an LSI tester 100. The LSI tester 100 has pin electronics 107A and 107B, each having a tester driver 112, a tester comparator 113, and a vernier 111 that finely adjusts the timing of signals provided to the input section of the tester driver 112. The LSI tester 100 outputs the data DATA from the tester driver 112 of the pin electronics 107A and outputs a clock CLK from the tester driver 112 of the pin electronics 107B.

When the LSI of the first preferred embodiment with the above configuration is brought into normal operation, the test mode signal STM1 indicating the selection of the output signal of the internal logic 50 may be provided to the test mode terminal 14.

Figure 2:
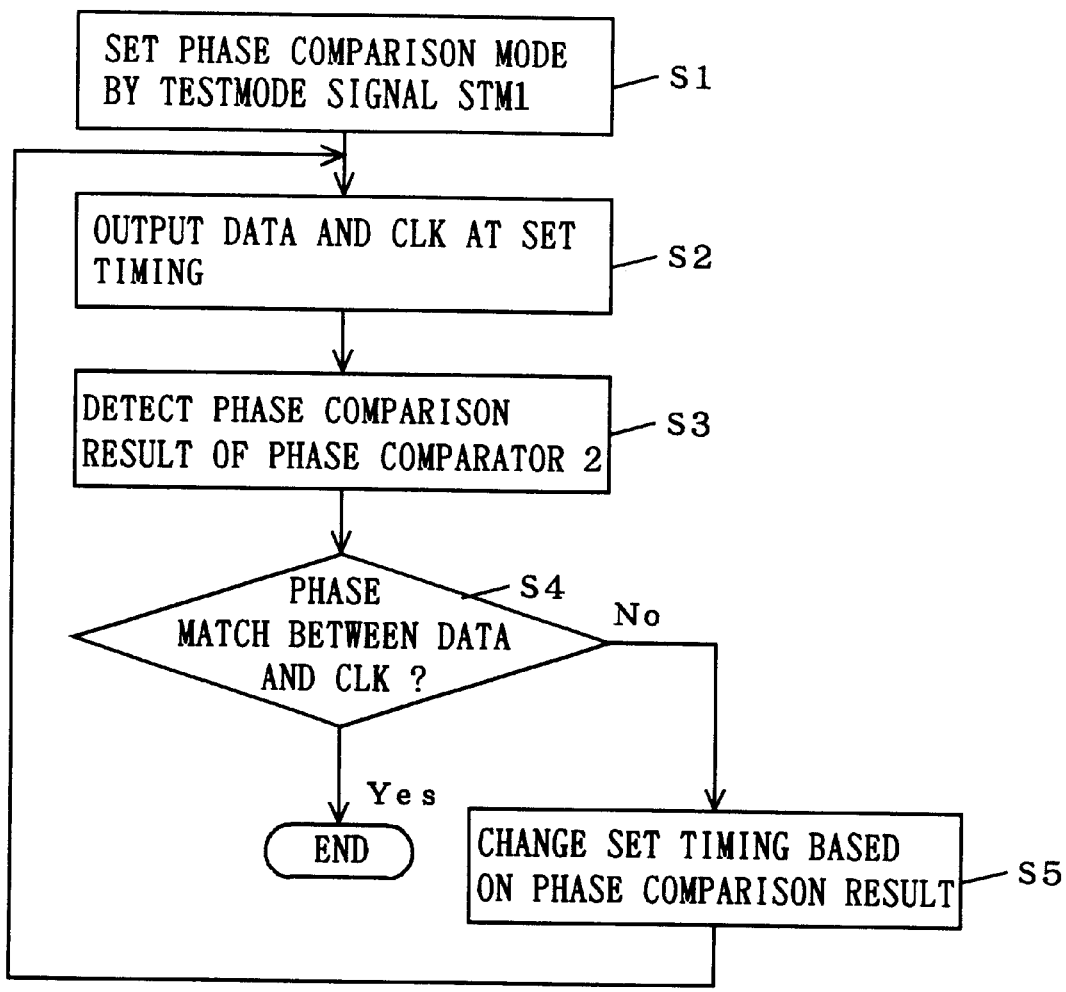
FIG. 2 is a flowchart of a phase comparison method using the LSI of the first preferred embodiment.

FIG. 2 is a flowchart showing the procedure of a method in which an LSI tester 100 determines the output timings of data DATA and a clock CLK in an LSI having the I/O buffer cell 1 of the first preferred embodiment. Referring to FIG. 2, the above procedure will be described.

In step S1, a test mode signal STM1 that indicates the selection of the phase comparison result obtained by a phase comparator 2 is provided to a test mode terminal 14 of an LSI, so that the phase comparison result of the phase comparator 2 is outputted from an MUX 3 to the input section of a driver 8 (i.e., it is set to a phase comparison mode).

In step S2, data DATA and a clock CLK are outputted to a data terminal 5 and a clock terminal 13, respectively, at a set timing that has been preset through an LSI tester 100.

In step S3, there is detected the phase comparison result of the phase comparator 2 in an I/O buffer cell 1 which is outputted from the data terminal 5 by the driver 8. By inputting the phase comparison result obtained from the data terminal 5 to a tester comparator 113 of a pin electronics 107A, the LSI tester 100 can detect the phase comparison result.

In step S4, based on the phase comparison result obtained in step S3, it is judged whether a phase match between the data DATA and the clock CLK could be indicated. When judged a match (YES), the processing is completed. When judged a mismatch (NO), it goes to step S5. The match/mismatch judgement based on the phase comparison result in step S4 is attained, for example, when a phase comparison result indicates a perfect match, alternatively, when the quantity of change in set timing based on a phase comparison result reaches a minimum timing resolution (time) of the LSI tester 100 in the course of searching by using binary search method.

In step S5, based on the phase comparison result, the sweeping of signals (fine adjustment) is performed by at least either vernier 111 of the pin electronics 107A and 107B to change the set timing in such a direction as to provide a match between edge E1 of the data DATA and edge E2 of the clock CLK, and then returns to step S2.

Thereafter, the above steps S2 to S5 are repeated until in step S4 it is judged that the phase comparison result has indicated a match.

By employing, as a reference, the timing at which the phase of the data DATA is arranged to match with that of the clock CLK in the processing shown in FIG. 2, the timing value of data to be described in the test program of the LSI tester 100 is corrected so that a predetermined setup time (e.g., 0.2 ns) is satisfied between the data DATA and the clock CLK. At the timing thus obtained, a functional operation test vector (test pattern) for a device is run.

Thus, setting of the timing conditions of the LSI tester 100 by using, as a reference, the timing providing a phase match between the data DATA and the clock CLK in the I/O buffer cell 1, prevents the timing skew of the LSI tester 100 or the variations in the transmission lines such as the DUT board, from exerting adverse effects on the timing verification of the LSI according to the first preferred embodiment. This permits a timing verification test of high accuracy for the LSI of the first preferred embodiment.

In addition, the time required for the phase adjustment processing shown in FIG. 2 is in the range of from several hundreds μ seconds to a few seconds at the most, causing no problem in the practical use.

Moreover, since a reference timing is set depending on a minimum timing resolution, a timing verification test of high accuracy can be conducted for the LSI of the first preferred embodiment, without requiring that test equipment such as the LSI tester 500 which performs the timing test for the LSI of the first preferred embodiment must have high performance and cause less skew. This avoids an increase in test cost.

It is theoretically possible to have the configuration in which without providing the test mode terminal 14, the test mode signal STM1 is caused to generate in the interior of the LSI based on data obtained from the data terminal 5, and then provided to the test mode input section 4.

Second Preferred Embodiment

Figure 3:
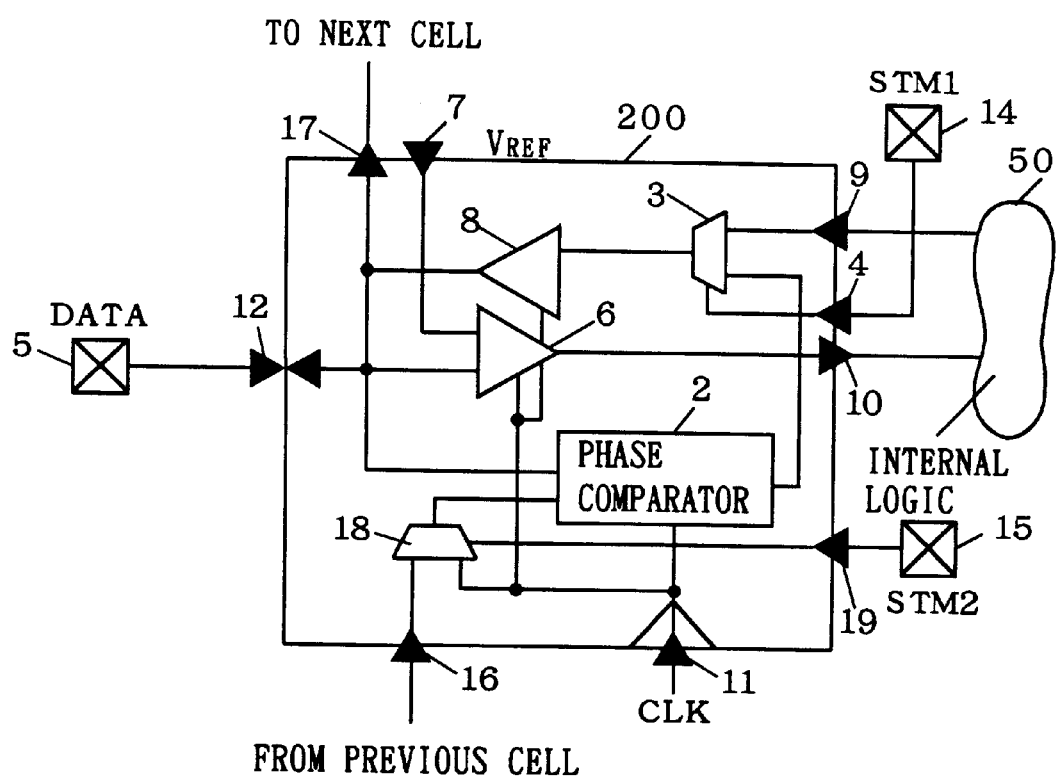
FIG. 3 is a circuit diagram of the internal configuration of an I/O buffer cell of an LSI according to a second preferred embodiment of the present invention.

FIG. 3 is a circuit diagram of the configuration of an I/O buffer cell of an LSI according to a second preferred embodiment.

Referring to FIG. 3, an I/O buffer cell 200 of the second preferred embodiment contains an MUX 18 in addition to an MUX 3, and a test mode terminal 15 serving as a bonding pad or package terminal is disposed externally of the I/O buffer cell 200.

A test mode signal STM2 inputted from the test mode terminal 15 is provided to the control input of the MUX 18 through a test mode input section 19. The MUX 18 uses the out-of cell input signal obtained from a cell signal input section 16 as a first input, and uses the clock CLK obtained from a clock input section 11 as a second input. Based on a test mode signal STM2, the MUX 18 outputs either the clock CLK or the external signal obtained from the cell signal input section 16, to a first input of a phase comparator 2.

Data DATA obtained from a data terminal 5 is provided to the input section of a receiver 6 and a second input of the phase comparator 2 through a data I/O section 12, and is also outputted externally of the cell as an out-of cell output signal, through a cell signal output section 17. Other features of the configuration are the same as those of the I/O buffer cell 1 in the first preferred embodiment and therefore its description is omitted here.

On the I/O buffer cell 200 with the above configuration in the second preferred embodiment, a test mode signal STM1 indicating the selection of the phase comparison results of the phase comparator 2 is provided to the test mode terminal 14 of the LSI, and a test mode signal STM2 indicating the selection of the out-of cell input signal obtained from the cell signal input section 16 is provided to the test mode terminal 15.

Then, the phase adjustment between the data DATA and the out-of cell signal obtained from the cell signal input section 16 can be realized by performing processing similar to the phase adjustment between the clock CLK and the data DATA as described in steps S2 to S5 in FIG. 2.

Therefore, setting of the timing conditions by using, as a reference, the timing providing a phase match between the data DATA and the out-of cell input signal obtained from the test mode terminal 14 in the I/O buffer cell 200, permits a timing verification test of high accuracy with respect to the LSI of the second preferred embodiment, as in the LSI of the first preferred embodiment.

In addition, by causing the MUX 18 to select a clock CLK, it is possible to set timing conditions by using, as a reference, the timing providing a phase match between the data DATA and the clock CLK in the I/O buffer cell 200, as in the first preferred embodiment.

Thus, by monitoring the phase comparison result, the LSI of the second preferred embodiment can selectively recognize a reference timing between data DATA and an out-of cell input signal or a reference timing between data DATA and a clock CLK in the I/O buffer cell 200.

As in the first preferred embodiment, the time needed in phase adjustment processing for the LSI of the second preferred embodiment cause no problems in the practical use, thus avoiding an increase in test cost.

It is theoretically possible to have the configuration in which without providing test mode terminals 14 and 15, test mode signals STM1 and STM2 are caused to generate in the interior of the LSI, based on the data DATA obtained from the data terminal 5, to provide them to the test mode input sections 4 and 19, respectively.

Third Preferred Embodiment

Figure 4:
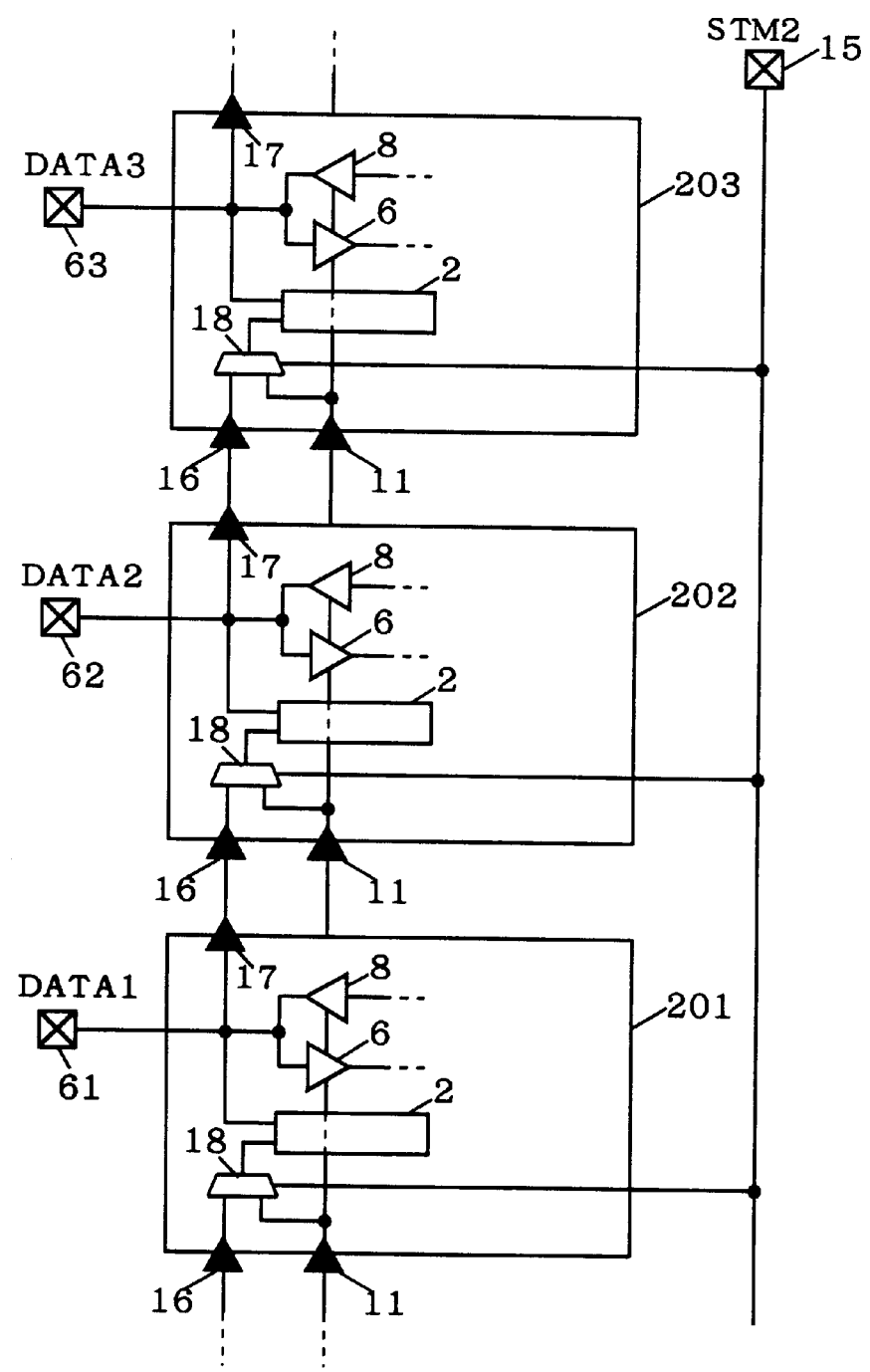
FIG. 4 is a circuit diagram of the configuration of an I/O buffer cell group of an LSI according to a third preferred embodiment of the present invention.

FIG. 4 is a circuit diagram showing the configuration of an I/O buffer cell group of an LSI according to a third preferred embodiment.

In an I/O buffer cell group of an LSI of the third preferred embodiment, a plurality of I/O buffer cells, each having the same configuration as the I/O buffer cell 200 of the second preferred embodiment, are connected in series from the first to final stages. That is, each I/O buffer cell (except for the I/O buffer cell of the first stage) receives the cell output signal obtained from the signal output section 17 of the cell of ante-stage, as the out-of cell input signal obtained from its own cell signal input section 16. In FIG. 4, only three I/O buffer cells 201 to 203, each having the same internal configuration as the I/O buffer cell 200 shown in FIG. 3, are shown representatively, with parts omitted. For convenience in illustrating the invention, description will now be made with regard to the I/O buffer cells 201 to 203.

The I/O buffer cells 201 to 203 receive at the control input of their respective MUX 18 a test mode signal STM2 obtained from a test mode terminal 15, and receive DATA 1 to DATA 3 obtained from data terminals 61 to 63, respectively, at a second input of their respective phase comparator 2 and the input section of their respective receiver 6. Also, the cells 201 to 203 output a cell output signal from their respective cell signal output section 17 to the cell signal input section 16 of the next I/O buffer cell.

On the I/O buffer cell group with the above configuration in the third preferred embodiment, the test mode signal STM1 indicating the selection of the phase comparison result of the phase comparator 2 is provided to a test mode terminal 14 of an LSI (not shown in FIG. 4), and the test mode signal STM2 indicating the selection of the out-of cell input signal obtained from the cell of ante-stage through the cell signal input section 16 is provided to a test mode terminal 15.

Then, the phase adjustment between the cell output signal of ante-stage and the data DATA of its own stage can be realized by performing processing similar to the phase adjustment between the clock CLK and the data DATA as shown in steps S2 to S5 in FIG. 2. It is necessary to perform this processing per I/O buffer cell in the I/O buffer cell group.

Therefore, setting of the timing conditions by using, as a reference, the timing providing a phase match between the data DATA and the output signal of ante-stage in each of the I/O buffer cells 201 to 203, permits a timing verification test of high accuracy with respect to each I/O buffer cell of the I/O buffer group of the LSI according to the third preferred embodiment, as in the first preferred embodiment.

In addition, as in the second preferred embodiment, by monitoring the phase comparison result, the LSI of the third preferred embodiment can selectively recognize a reference timing between data DATA and the cell output signal of ante-stage or a reference timing between data DATA and a clock CLK in the I/O buffer cells 201 to 203.

As in the first preferred embodiment, the time needed in phase adjustment processing for each I/O buffer cell of the LSI in the third preferred embodiment causes no problems in the practical use and thus avoids an increase in test cost.

Forth Preferred Embodiment

Figure 5:
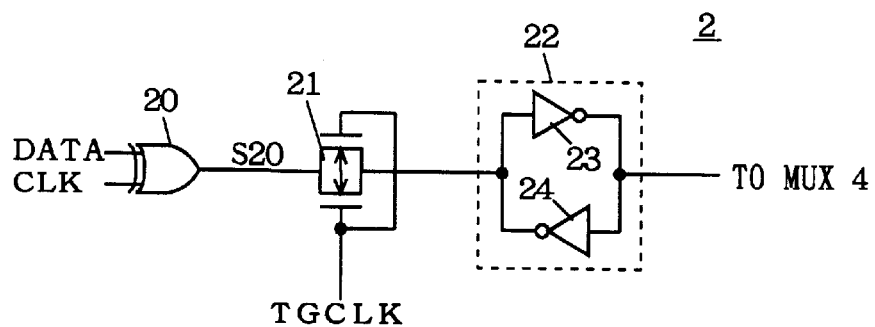
FIG. 5 is a circuit diagram of the internal configuration of an a phase comparator of an LSI according to a fourth preferred embodiment of the present invention.

FIG. 5 is a circuit diagram showing the internal configuration of a phase comparator according to a fourth preferred embodiment. This phase comparator is identical with that in the I/O buffer cell of the first to third preferred embodiments.

Referring to FIG. 5, an EXOR gate 20 receives data DATA and a clock CLK and outputs an EXOR output signal S20 to a latch section 22 through a transfer gate 21. The ON/OFF of the transfer gate 21 is controlled by the "H"/"L" of a clock TGCLK. The clock TGCLK is a clock for indicating a sampling period which becomes "H" during a predetermined period in the vicinity of an edge at which a clock CLK rises. The clock CLK itself may be used as a clock TGCLK. Alternatively, such a clock TGCLK may be applied from externally or generated in the interior of an LSI based on the clock CLK, as in a fifth preferred embodiment described later.

The latch section 22 is made up of the loop connection constituted by inverters 23 and 24, and the output of the latch section 22 is outputted to a first input of an MUX 3 as a phase comparison result.

On the phase comparator of the fourth preferred embodiment with the above configuration, an appropriate setting of the clock TGCLK leads to that the phase comparison result of "L" is outputted for a phase difference between the clock CLK and data DATA, while the phase comparison result of "H" is outputted for a phase match between the clock CLK and data DATA.

Since the phase comparator of the fourth preferred embodiment consists of the EXOR gate 20, the transfer gate 21 and the inverter 23, its circuit configuration is simple.

Fifth Preferred Embodiment

Figure 6:
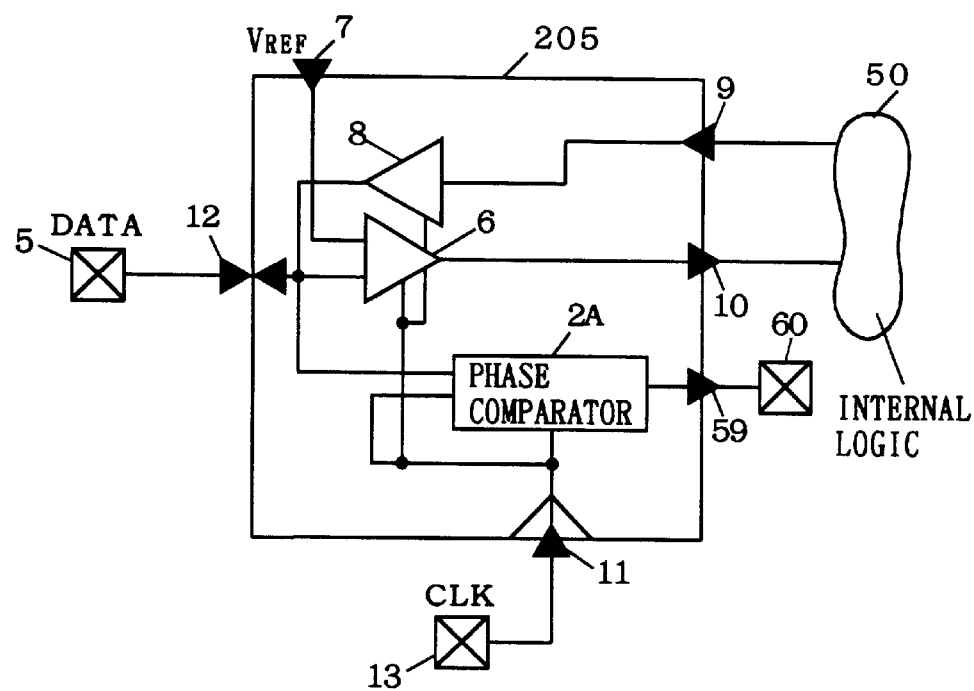
FIG. 6 is a circuit diagram of the internal configuration of an I/O buffer cell of an LSI according to a fifth preferred embodiment of the present invention.

FIG. 6 is a circuit diagram showing the configuration of an I/O buffer cell of an LSI according to a fifth preferred embodiment.

Referring to FIG. 6, the phase comparison result of a phase comparator 2A in an I/O buffer cell 205 of the fifth preferred embodiment is outputted to a phase comparison result outputting terminal 60 through a phase comparison result output section 59. Compared to the I/O buffer cell 1 of the first preferred embodiment shown in FIG. 1, an MUX 3 is omitted and a signal input section 9 is directly connected to the input section of a driver 8. Other features of the configuration are the same as those of the I/O buffer cell 1 of the first preferred embodiment, and it is believed that description thereof is unnecessary.

On the I/O buffer cell 205 of the fifth preferred embodiment with the above configuration, a phase adjustment processing between the clock CLK and data DATA can be realized by performing a phase adjustment between the clock CLK and data DATA, as shown in steps S2 to S5 in FIG. 2.

Figure 7:
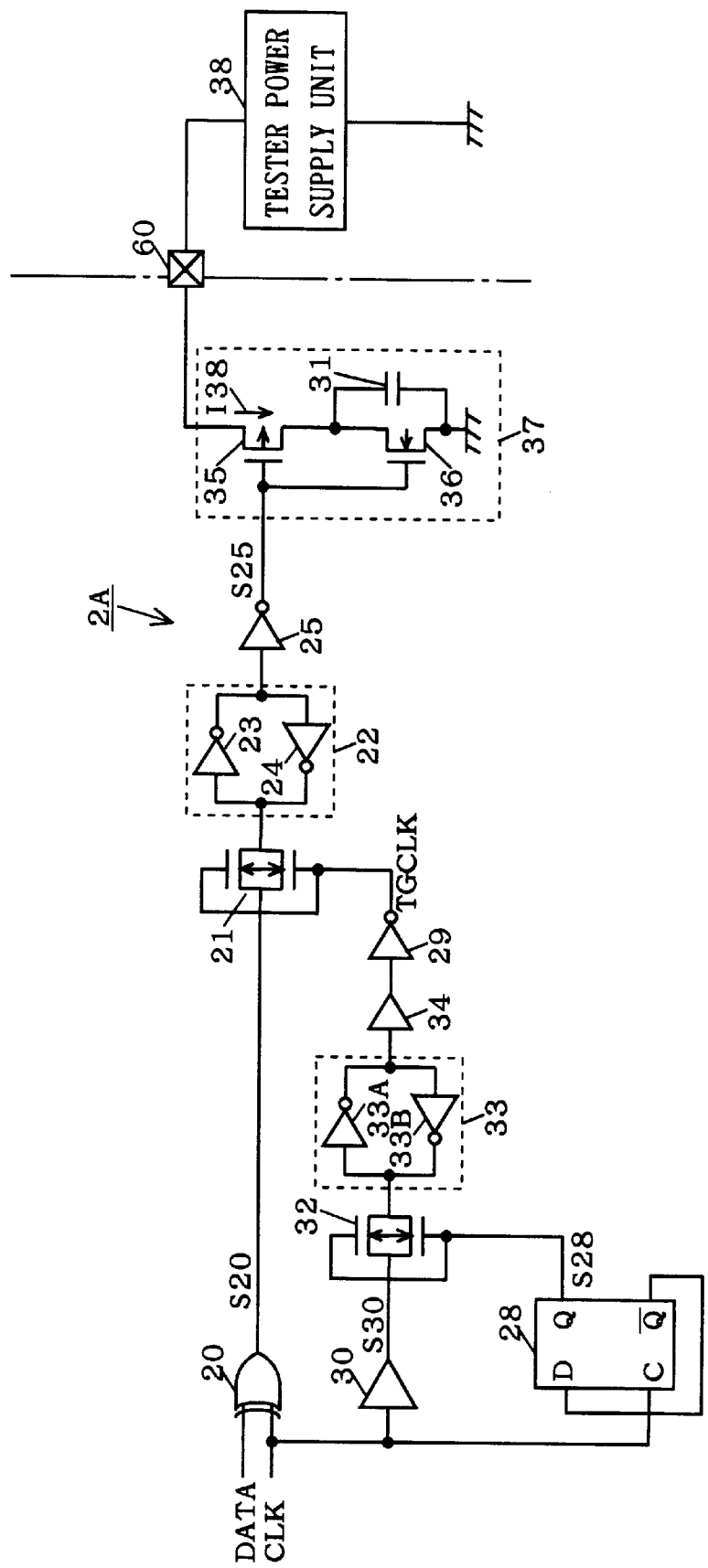
FIG. 7 is a circuit diagram of the internal configuration of a phase comparator of an LSI according to the fifth preferred embodiment.

FIG. 7 is a circuit diagram showing the internal configuration of a phase comparator of the fifth preferred embodiment. As show in FIG. 7, an EXOR gate 20 receives data DATA and a clock CLK, and outputs an EXOR output signal S20 to a latch section 22 through a transfer gate 21. The ON/OFF of the transfer gate 21 is controlled by the "H"/"L" of a clock TGCLK.

The latch section 22 is made up of a loop connection constituted by inverters 23 and 24, and the output of the latch section 22 is outputted to the input section of an inverter 25. The output signal of the inverter 25 is applied to a PMOS transistor 35 and an NMOS transistor 36 of an inverter 37.

The inverter 37 is placed between a tester power supply unit 38 and the ground level. The source of the PMOS transistor 35 of the inverter 37 is connected to the tester power supply unit 38 through a phase comparison result outputting terminal 60. A floating capacitor 31 parasitizes between the drain and source of the NMOS transistor 36. The tester power supply unit 38 supplies power source to the phase comparison result outputting terminal 60 of an LEI tester 100 and also functions to detect the quantity of current flowing through the phase comparison result outputting terminal 60.

On the other hand, a clock CLK is also provided to the input section of a delay buffer 30 and a clock input C of a flip-flop 28. A delay clock S30 outputted from the delay buffer 30 is outputted to a latch section 33 through a transfer gate 32.

An inverting output section $\overline{Q}$ is short-circuited with a data input section D in the flip-flop 28, and an output signal S28 obtained from an output section Q is outputted to the gate of the transfer gate 32.

The transfer gate 32 goes into ON/OFF state by the "H"/"L" of the output signal S28 of the flip-flop 28. The latch section 33 is made up of a loop connection constituted by inverters 33A and 33B.

The output of the latch section 33 is provided, as a clock TGCLK, to the gate of the transfer gate 21 through the delay buffer 34 and the inverter 29.

Figure 8:
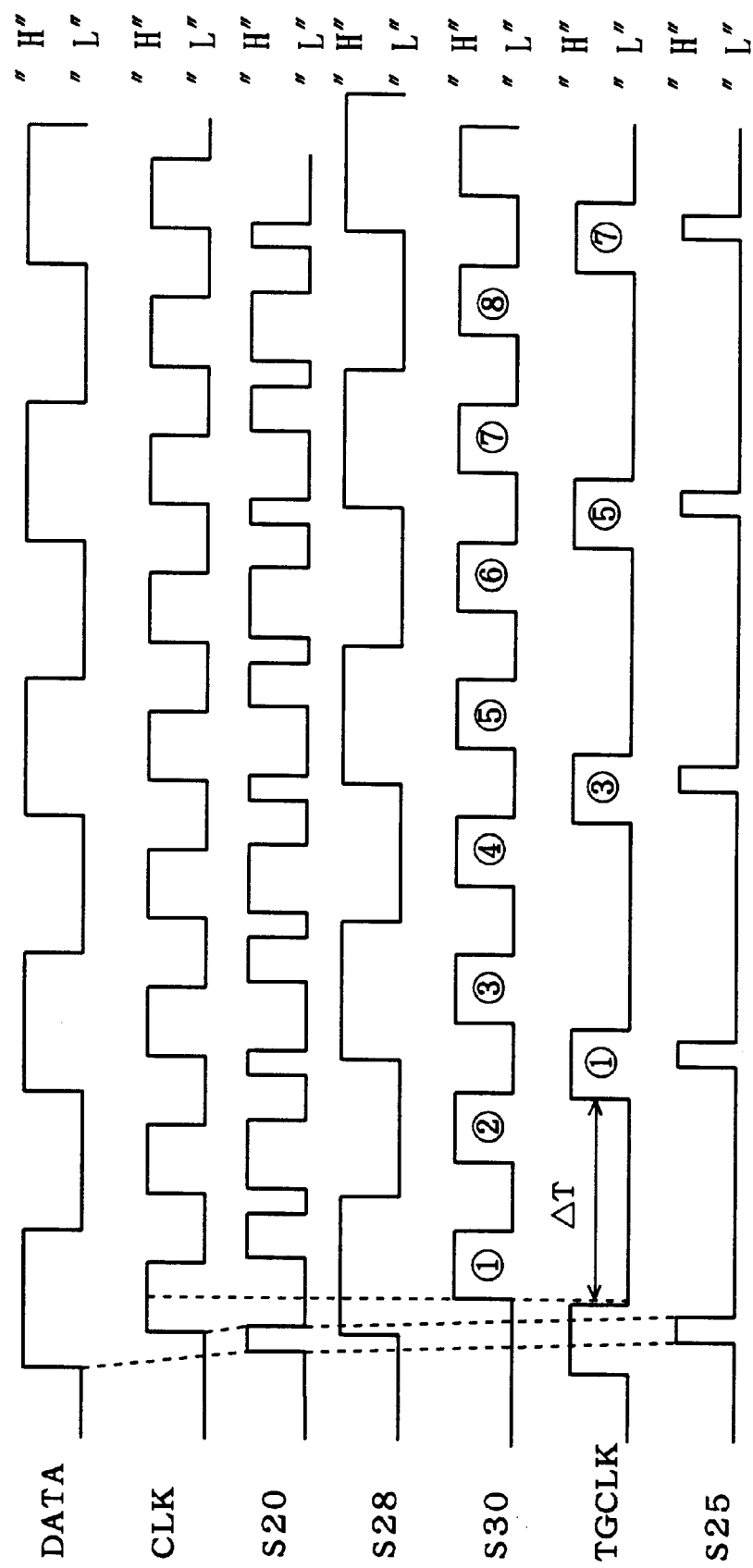
FIG. 8 is a timing chart illustrating a phase comparison operation of the phase comparator of the fifth preferred embodiment.

FIG. 8 is a timing chart illustrating the phase comparison operation of a phase comparator according to the fifth preferred embodiment. Referring to FIG. 8, the phase comparison operation of this phase comparator will be described hereafter.

The flip-flop 28 receives the clock CLK from a clock input section C and, due to the short-circuit between an inverting output section $\overline{Q}$ and a data input section D, outputs an output signal S28 which is obtained by dividing the clock CLK by two.

On the other hand, a delay buffer 30 delays a clock CLK by a predetermined time to output a delay clock S30. The "H" period of the delay clock S30 is sampled every other time by the on-off control of a transfer gate 32 which depends on the output signal S28 of the flip-flop 28. That is, from among H periods ① to ⑧ of the output signal S28, only "H" periods ①, ③, ⑤ and ⑦ are latched by the latch section 33.

The "H" period of the delay clock S30 latched by the latch section 33 appears as a clock TGCLK, with a delay time ΔT which is obtained by allowing it to pass through the delay buffer 34 and the inverter 29. That is, "H" periods ①, ③, ⑤ and ⑦ of the delay clock S30 appear as "H" periods ①, ③, ⑤ and ⑦ of the clock TGCLK, respectively.

Here, by appropriately setting a signal propagation delay time with the delay buffers 30 and 34, the "H" period (sampling period) of the clock TGCLK during a period in the vicinity of an edge at which the clock CLK rises, can be set every other time.

Referring again to FIG. 8, since the phase of data DATA is advanced somewhat against that of the clock CLK, the EXOR output signal S20 becomes "H" by such a phase difference and the EXOR output signal S20 of "H" is sampled by the latch section 22 only when the clock TGCLK is in "H" period. The output signal of an inverter 25 through the inverter 25 is applied to the PMOS transistor 35 of the inverter 37 and the gate of NMOS transistor 36, as a gate signal S25.

Figure 9:
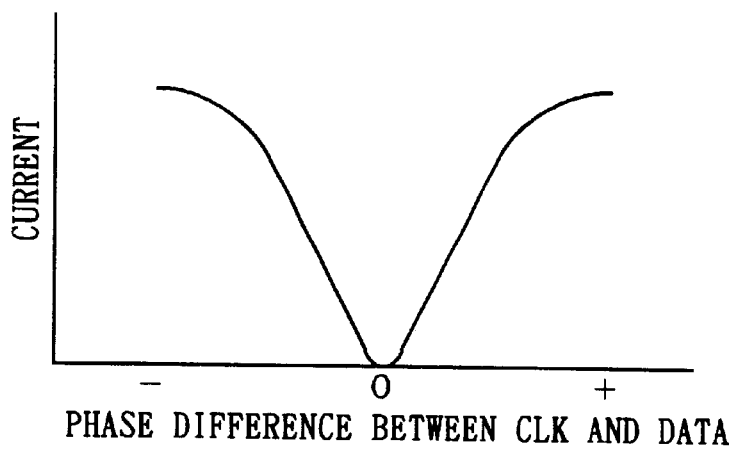
FIG. 9 is a waveform diagram illustrating a phase comparison operation of the phase comparator of the fifth preferred embodiment.

In the cases where the phase of data DATA is advanced against that of the clock CLK as shown in FIG. 8, there always exists the period that the gate signal S25 becomes "H", and therefore, a pass current flows through the inverter 37 and charge and discharge currents flow through a floating capacitor 31. Then, as shown in FIG. 9, the current flows between the tester power supply unit 38 and ground level. Accordingly, a phase difference between the data DATA and clock CLK can be recognized by the quantity of current (i.e., the phase comparison result) obtained from the phase comparison result outputting terminal 60.

On the other hand, where the phase of the clock CLK is matched with that of data DATA, the gate signal S25 is fixed to "L", thus being free from the above-noted pass current nor charge and discharge currents, as shown in FIG. 9. Therefore, the phase match between the clock CLK and data DATA can be recognized by the quantity of current (i.e., "0") which is obtained from the phase comparison result outputting terminal 60.

With the above configuration, the phase comparator 2A of the fifth preferred embodiment can recognize as a phase comparison result when the current quantity corresponding to the quantity of the phase difference between the clock CLK and data DATA, flows through the phase comparison result outputting terminal 60.

Moreover, in the phase comparator of the fifth preferred embodiment, by providing a circuit for generating a clock TGCLK based on a clock CLK and setting the sampling period of an EXOR output signal S20 to a desired period, it is possible to output a phase comparison result assuredly judging a phase match/mismatch between a clock CLK and data DATA event for a complicated phase relationship therebetween.

Figure 10:
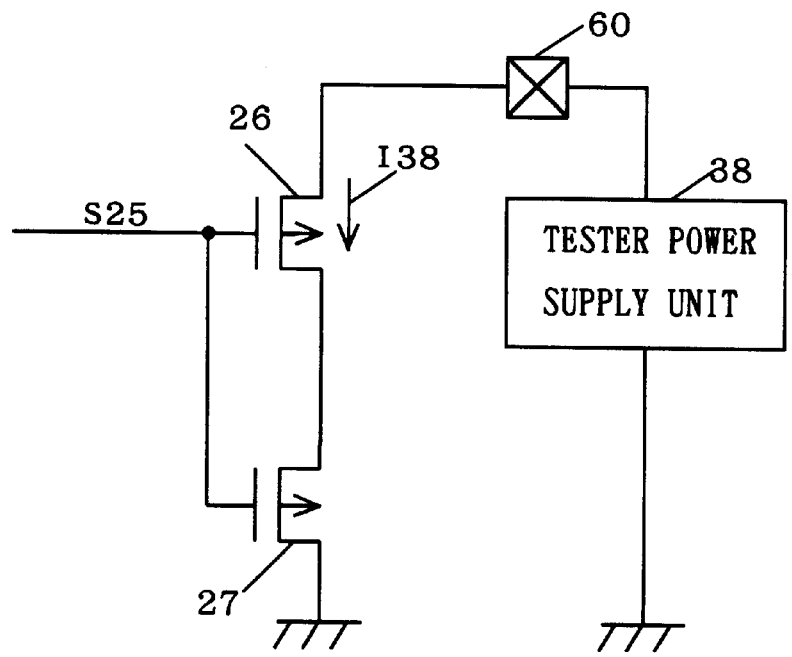
FIG. 10 is a diagram for explaining another aspect of the phase comparator of the fifth preferred embodiment.

Instead of the inverter 37, the direct connect circuit of NMOS transistors 26 and 27 as shown in FIG. 10 may be employed so that a gate signal 25 is applied to the gates of the NMOS transistors 26 and 27. In this case, when the gate signal S25 becomes "H", the NMOS transistors 26 and 27 are both in the state of ON which provides an increase in the current quantity flowing through the phase comparison result outputting terminal 60, and thus making the quantity of a phase difference clear.

The number of transistors to be connected in series may be three or more. One NMOS transistor may be placed between the tester power supply unit 38 and ground level.

Sixth Preferred Embodiment

There occurs the period of time that the phase comparison result of a phase comparator 2A has an unstable value due to the jitters possessed by data DATA and a clock CLK Hence, a phase comparator of a sixth preferred embodiment is characterized in detecting precisely a phase match/mismatch between data DATA and a clock CLK even when jitters are contained in both.

Figure 11:
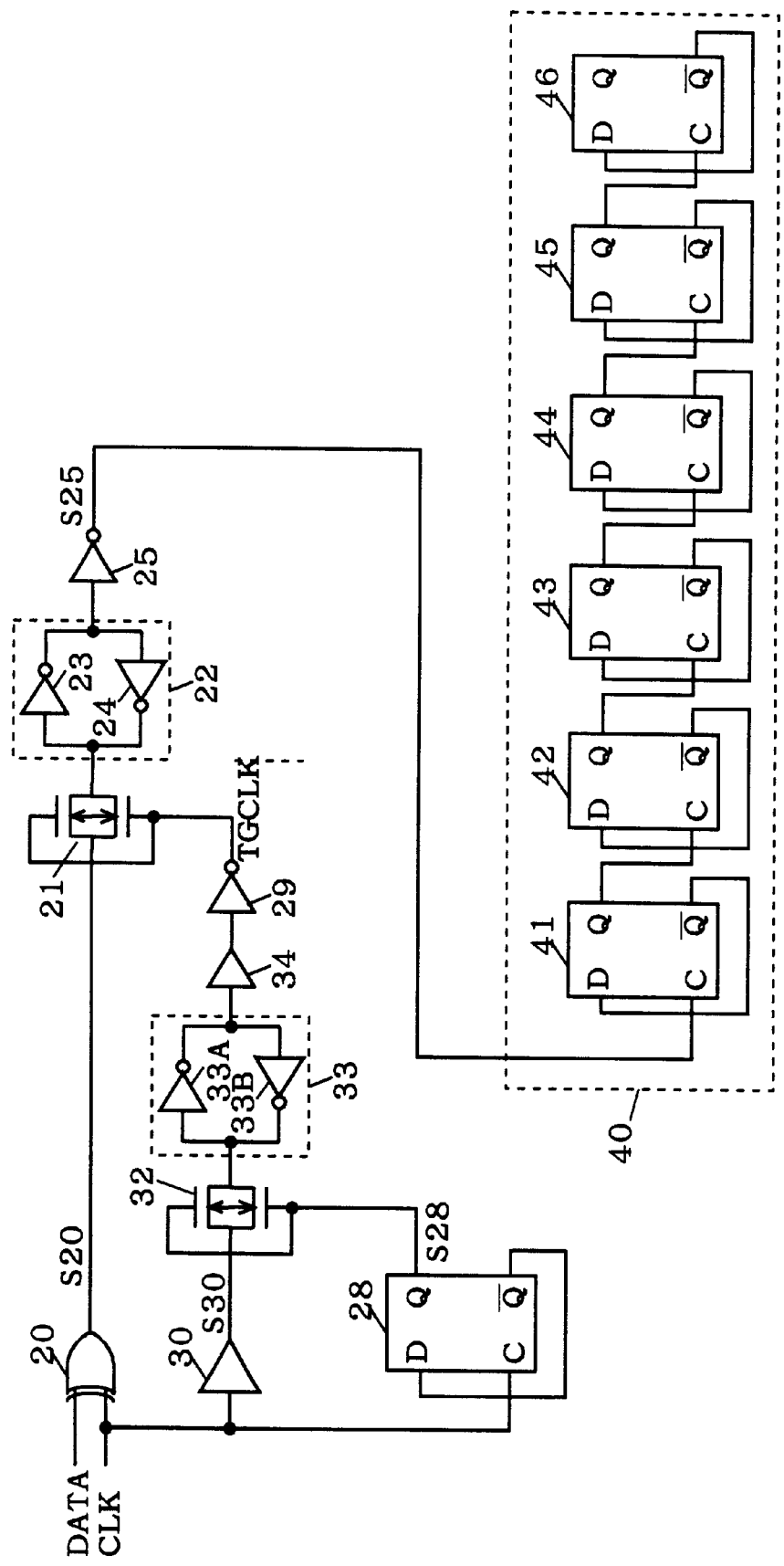
FIG. 11 is a circuit diagram of the internal configuration of a phase comparator of an LSI according to a sixth preferred embodiment of the present invention.
Figure 12:
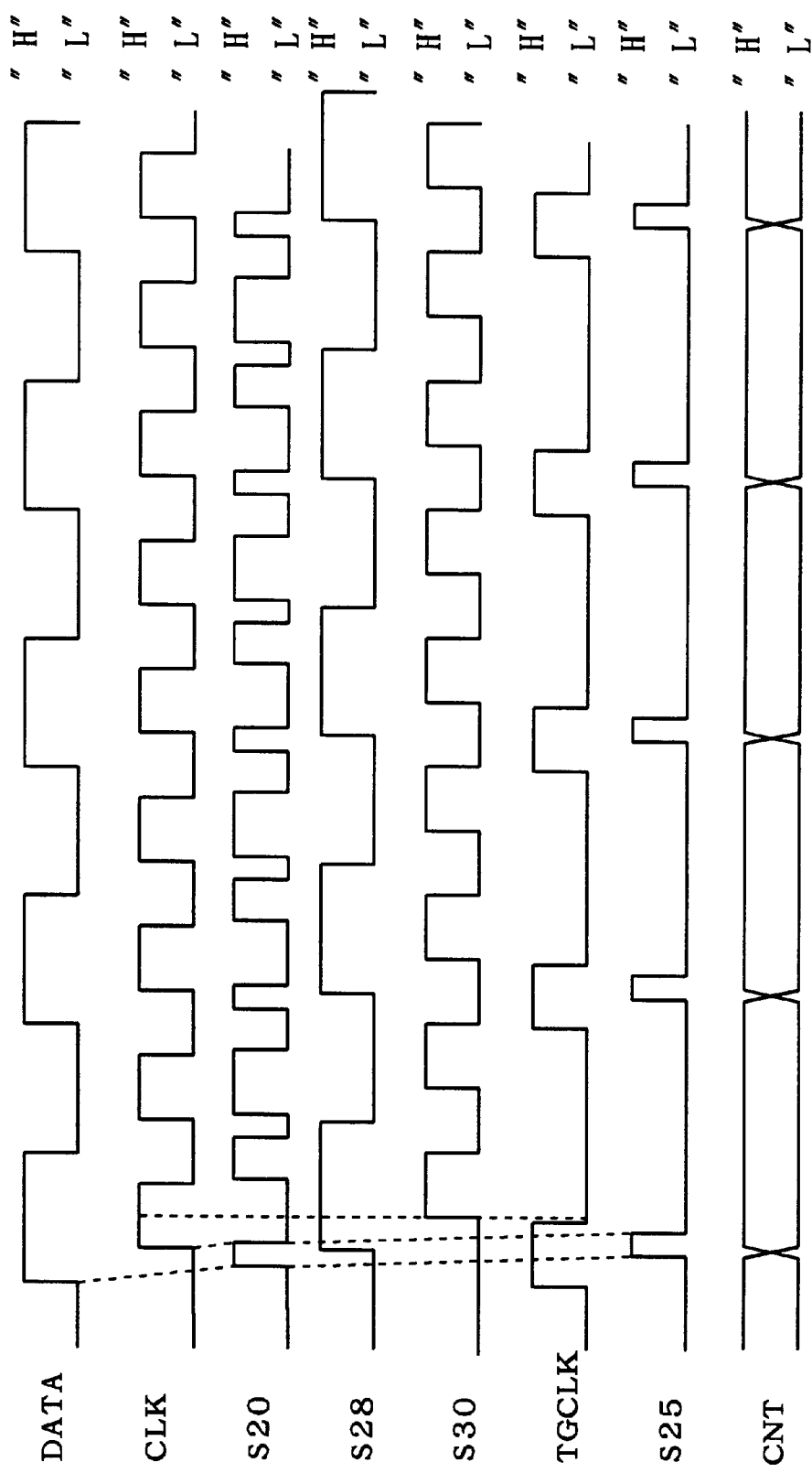
FIG. 12 is a timing chart illustrating a phase comparison operation of the phase comparator of the sixth preferred embodiment.

FIG. 11 is a circuit diagram showing the internal configuration of a phase comparator according to the sixth preferred embodiment. As shown in this figure, a gate signal S25 being the output of an inverter 25 is taken in a digital counter 40.

The digital counter 40 comprises flip-flops 41 to 46, each of whose inverting output section $\overline{Q}$ returns to their respective data input section D.

The flip-flop 41 receives at its clock input section C the gate signal S25, and its output section Q is connected to the clock input section C of the next flip-flop 42. In a similar manner, the output sections Q of the flip-flops 42 to 45 are connected to their respective clock input sections C of the flip-flops 43 to 46.

The configurations except for that of the digital counter 40 are the same as those of the phase comparator 2A of the fifth preferred embodiment, and therefore description thereof is omitted here.

In the phase comparator of the sixth preferred embodiment with the above configuration, the digital counter 40 can count the frequency at which the gate signal S25 rises to "H", every time it is detected. Accordingly, after the clock CLK is inputted during N-cycle, a count result CNT of 6-bit is obtainable from the inverting output sections $\overline{Q}$ of the flip-flops 41 to 46.

Thus, in the relationship between the count result CNT and the number of input cycles N of the clock CLK, it is judged that the phase of the clock CLK is matched with that of the data DATA when CNT<N, and the phase of the clock is mismatched with that of the data DATA when CNK=N.

For example, when the clock CLK is inputted during 64 cycles, an LSI tester 100 reads the count result CNT of the digital counter 40 and recognizes a phase match when CNT<64 and a phase mismatch when CNT=64.

As stated above, the phase comparator of the sixth preferred embodiment recognizes a phase match/mismatch by counting the number of rising to "H" of the gate signal S25 to obtain a precise frequency at which the gate signal S25 rises to "H". This permits a precise detection of a phase match/mismatch between a clock CLK and data DATA even if a jitter component is contained in the clock CLK or data DATA.

Seventh Preferred Embodiment

Figure 13:
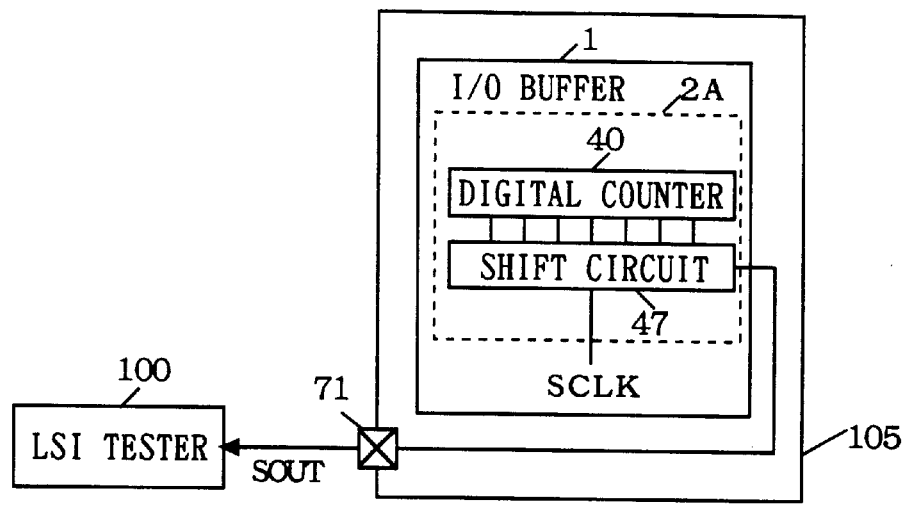
FIG. 13 is a diagram for explaining the configuration of an I/O buffer cell of an LSI according to a seventh preferred embodiment of the present invention.

FIG. 13 is a diagram illustrating the configuration of an LSI according to a seventh preferred embodiment. An I/O buffer cell 1 of an LSI 105 of the seventh preferred embodiment has a configuration similar to that of the I/O buffer cell 1 of the first preferred embodiment, and the LSI 105 has a phase comparator 2A having the same configuration as the phase comparator of the sixth preferred embodiment.

A shift circuit 47 latches each bit of a counter result CNT of the phase comparator 2A. When the shift circuit 47 receive a shift clock SCLK, it outputs the latched count result CNT serially as a scan output signal SOUT, from a phase comparison result outputting terminal 71 that is a serial output terminal.

In the LSI 105 of the seventh preferred embodiment with the above configuration, only the addition of one phase comparison result outputting terminal 71 as an external output terminal, enables to output externally a 6-bit count result CNT of the digital counter 40.

Eighth Preferred Embodiment

Figure 14:
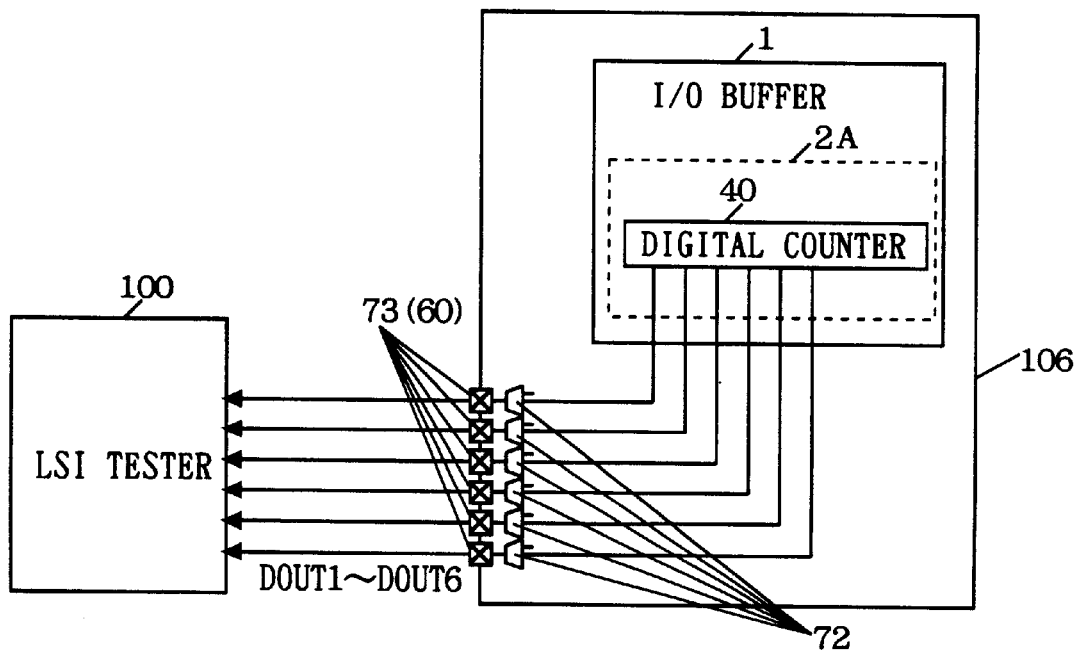
FIG. 14 is a diagram for explaining the configuration of an I/O buffer cell of an LSI according to an eighth preferred embodiment of the present invention.

FIG. 14 is a diagram for explaining the configuration of an LSI 106 according to an eighth preferred embodiment. An I/O buffer cell 1 of the eighth preferred embodiment has a configuration similar to that of the I/O buffer cell 1 of the first preferred embodiment, and the LSI 106 has a phase comparator 2A having the same configuration as the phase comparator of the sixth preferred embodiment. A digital counter 40 is arranged so that the count bits (inverting output sections $\overline{Q}$, not shown) of flip-flops 41 to 46 are outputted in parallel as parallel output signals DOUT1 to DOUT6, through six MUXs 72 and six primary terminals 73 (corresponding to a phase comparison result outputting terminal 71), respectively.

The six MUXs 72 receive at their respective first inputs the count bit of the digital counter 40 and receive at their respective second inputs the signals to be used in normal operation, e.g., the output signal of an internal logic (not shown). When outputting a count, the MUXs output the signal obtained from the first input to the corresponding primary terminal 73, whereas at other times they output the signal obtained from the second input to the corresponding primary terminal 73.

The LSI 106 of the eighth preferred embodiment with the above configuration effectively uses the existent primary terminals 73 serving as an external output terminal, to attain that the count result CNT of the digital counter 40 is outputted externally, without adding any external terminals for outputting a count result CNT.

Ninth Preferred Embodiment

Figure 15:
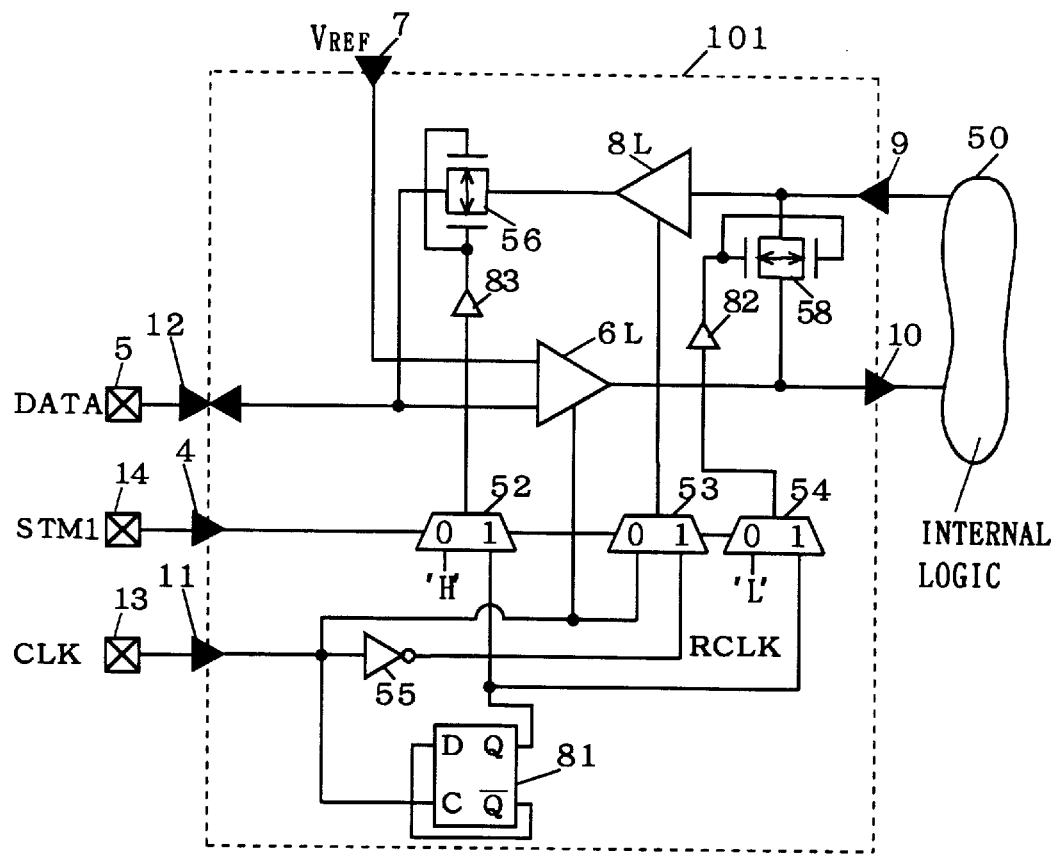
FIG. 15 is a circuit diagram of the internal configuration of an I/O buffer cell of an LSI according to a ninth preferred embodiment of the present invention.
Figure 16:
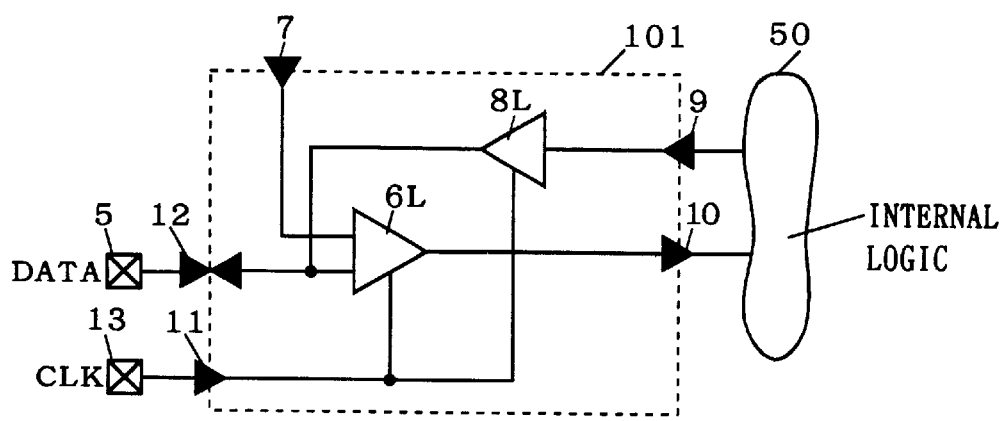
FIG. 16 is a circuit diagram of an equivalent circuit at the time of a first operation of an I/O buffer cell according to the ninth preferred embodiment.

FIG. 15 is a circuit diagram showing the configuration of an I/O buffer cell of an LSI according to a ninth preferred embodiment.

An I/O buffer cell 101 can give and receive signals through a data terminal 5, a clock terminal 13 and a test mode terminal 14, respectively, which are all provided externally. These terminals 5, 13 and 14 are disposed as a bonding pad or package terminal.

The clock CLK inputted from the clock terminal 13 is provided, through a clock input section 11, to a second input ("0") of an MUX 53, the control input of a receiver 6L, the input section of an inverter 55, and a clock input section C of a D-type flip-flop 81. A reverse clock RCLK being the output of the inverter 55 is provided to a first input ("1") of the MUX 53.

The inverting output section $\overline{Q}$ of the D-type flip-flop 81 is connected to its data input section D, and an output section Q is connected to a first input of an MUX 52 and also to a first input of an MUX 54. Due to the short-circuit between the inverting output section $\overline{Q}$ and the data input section D, the D-type flip-flop 81 outputs a signal obtained by dividing a clock CLK by two, from the output section Q.

The test mode signal STEM1 inputted from the test mode terminal 14 is provided in common to the control inputs of the MUXs 52 to 54 through a test mode input section 4. A second input of the MUX 52 is fixed to "H", and a second input of the MUX 54 is fixed to "L". The MUXs 52 to 54 output the signals obtained from their respective first/second input based on the "H"/"L" of the test mode signal STM1.

Data DATA inputted from the terminal 5 is provided to a first input of the receiver 6L through a data I/O section 12 and a transfer gate 56.

The operations of the receiver 6L and the driver 8L, each having a latching function, are controlled by the signals obtained from the their respective control inputs. The receiver 6L receives at its second input a reference voltage $V_{REF}$ through a reference voltage input section 7. By using the time at which a clock CLK rises to "H", as a trigger, the receiver 6L compares data DATA with the reference voltage $V_{REF}$ and performs buffering based on its comparison result to obtain an internal signal and then outputs it to an internal logic 50 from a signal output section 10. The receiver 6L also has a latching function for latching the internal signal.

The output of the receiver 6L is connected to the input of the driver 8L through a transfer gate 58, and the input of the receiver 6L is connected to the output of the driver 8L through the transfer gate 56. The driver 8L receives, via a signal input section 9, the output signal from the internal logic 50. By using the time at which the signal received at its control input rises to "H", as a trigger, the driver 8L outputs the output signal which is obtained by driving the received signal, from the data terminal 5 through the transfer gates 56, 58 and the data I/O section 12. The driver 8L also has a latching function for latching the output signal therein.

The output signal of the MUX 52 is provided to N channel gate of the transfer gate 56 through a buffer 83, the output signal of the MUX 53 is provided to the control input of the driver 8L, and the output signal of the MUX 54 is provided to N channel gate of the transfer gate 58 through a buffer 82.

The buffers 82 and 83 have signal propagation delay times ΔTB1 and ΔTB2, respectively, and the relationship therebetween is represented by ΔTB1<ΔTB2.

With the above configuration, when the test mode signal STM1 of "L" is provided to the test mode terminal 14, the transfer gate 56 is always in the state of ON, the transfer gate 58 is always in the state of OFF, and the clock CLK is applied to the control inputs of the receiver 6L and the driver 8L. Therefore, by forming the equivalent circuit shown in FIG. 16, the LSI 101 of the ninth preferred embodiment can perform normal operation.

On the other hand, when the test mode signal STM1 of "H" is provided to the test mode terminal 14, the clock CLK is applied to the control input of the receiver 6L and the reverse clock RCLK is applied to the control input of the driver 8L, so that the signal obtained from the output section of the D-type flip-flop 81 is applied to the N channel gates of the transfer gates 56 and 58 through the buffers 83 and 82, respectively. This results in the equivalent circuit as shown in FIG. 17, permitting a phase comparison between data DATA and the clock CLK.

Figure 17:
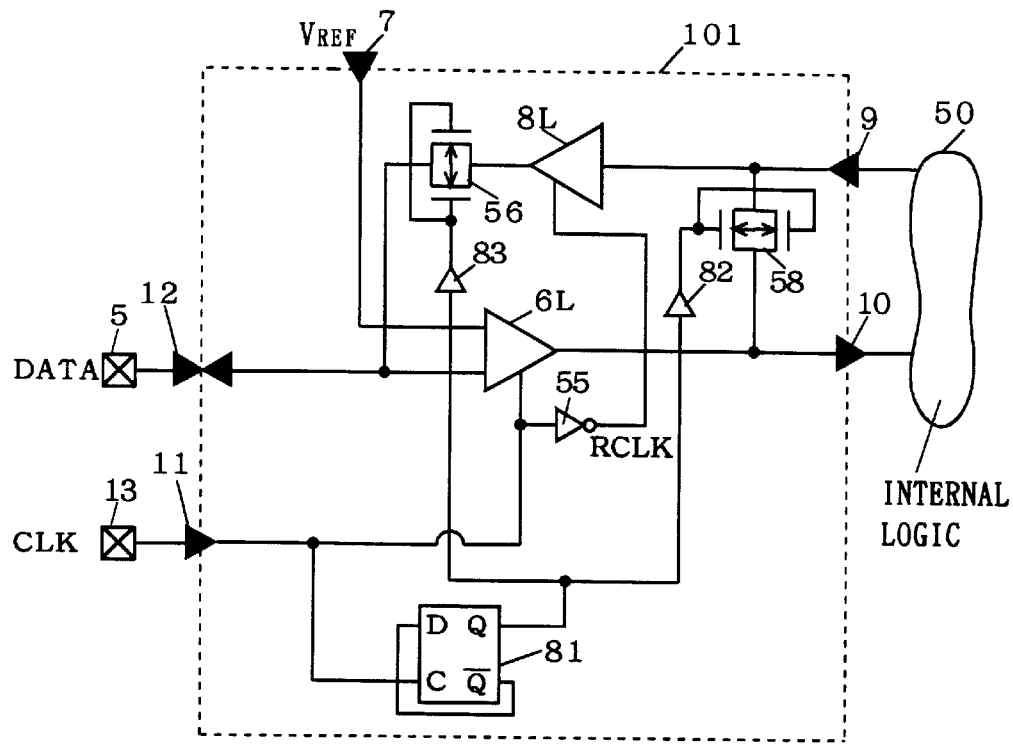
FIG. 17 is a circuit diagram of an equivalent circuit at the time of a second operation of the I/O buffer cell of the ninth preferred embodiment.
Figure 18:
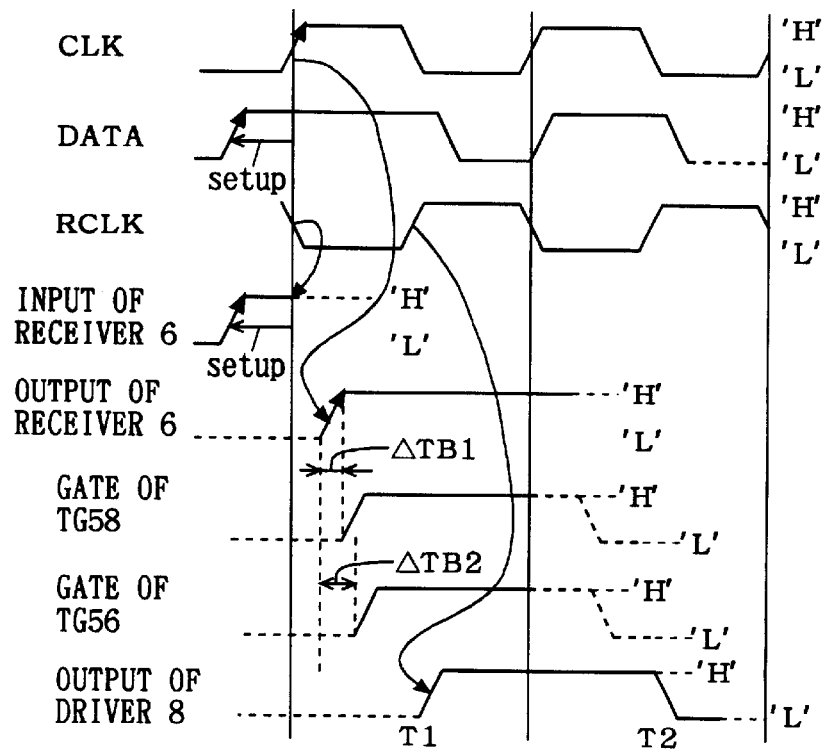
FIG. 18 is a timing chart illustrating the operation of the I/O buffer cell of the ninth preferred embodiment.
Figure 19:
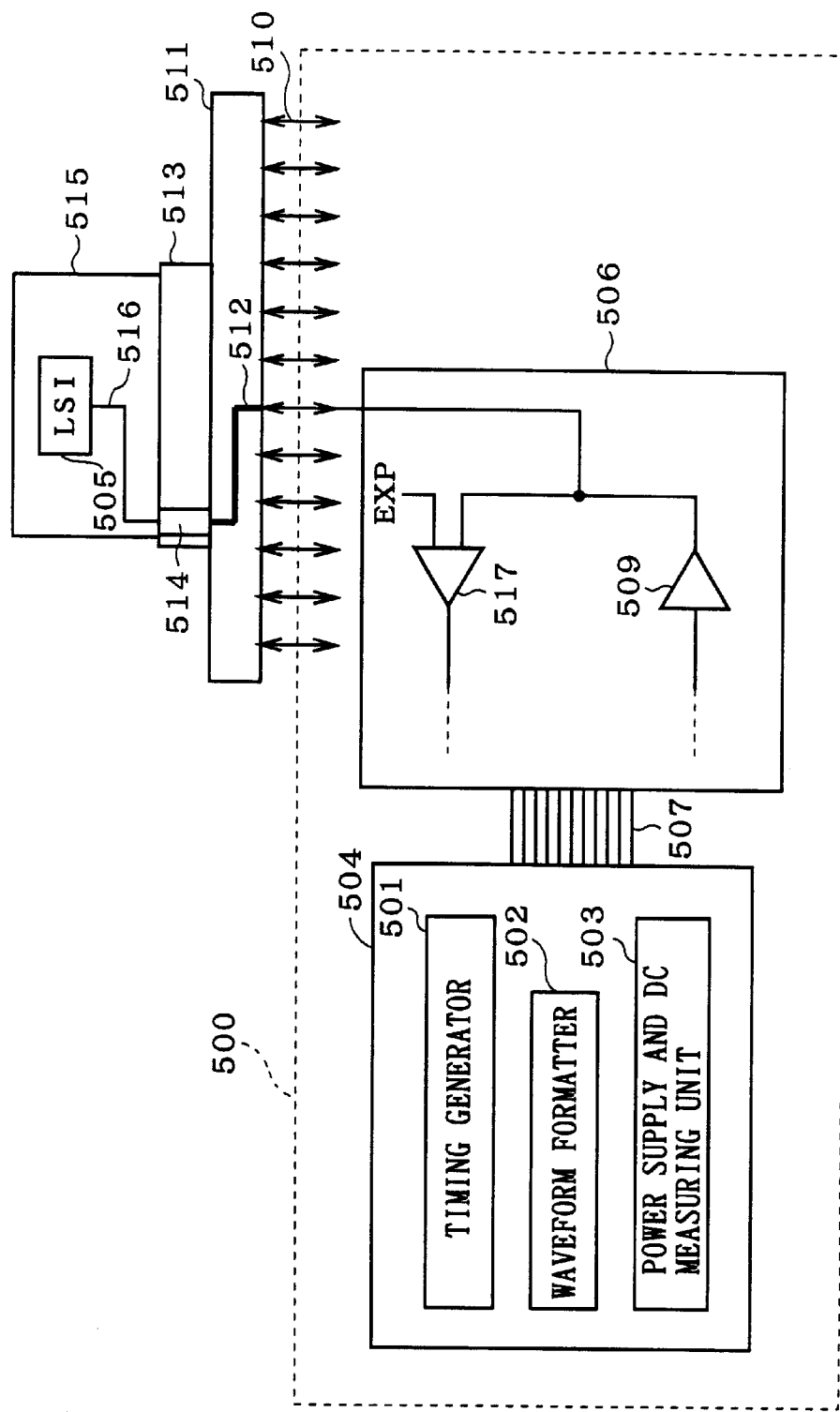
FIG. 19 is a diagram for explaining one configuration in conducting a test of an LSI by using an LSI tester in prior art.
Figure 20:
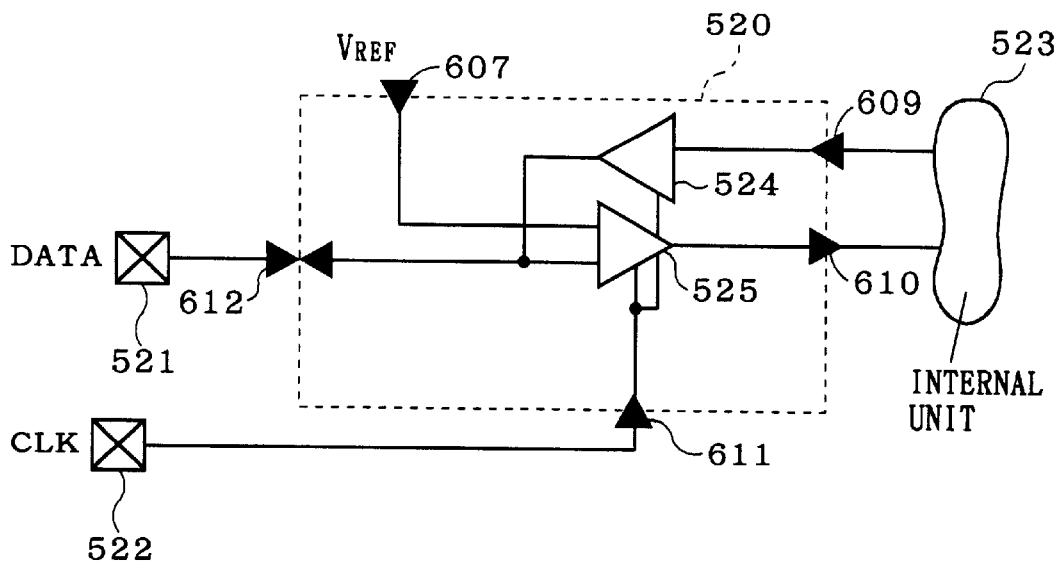
FIG. 20 is a circuit diagram of the internal configuration of an I/O buffer cell of an LSI prior art.
Figure 21:
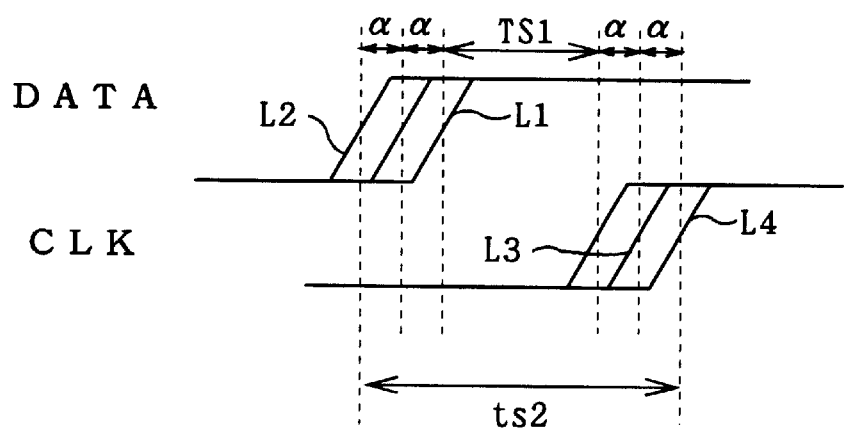
FIG. 21 is a timing chart illustrating a skew caused between data and a clock in prior art.

FIG. 18 is a timing chart illustrating the phase comparison operation of the ninth preferred embodiment which constitutes the equivalent circuit shown in FIG. 17. In FIG. 18, period T1 denotes the period the test mode signal STM1 of "H" is provided to a test mode terminal 14, and period T2 denotes the period the test mode signal STM1 of "L" is provided to the test mode terminal 14.

Referring to FIGS. 17 and 18, a phase comparison operation will be described hereafter. An LSI tester 100 outputs data DATA whose value is changed in synchronization with an edge at which a clock CLK rises. At this time, it is set so that the time the data DATA rises to "H" is advanced a setup time "setup" as compared to that of the clock CLK. Then, a flip-flop initialization circuit (not shown) initializes a D-type flip-flop 81 to "H" by using the "H" of the test mode signal STM1 as a trigger.

In the cases where data DATA changes from "L" to "H" as shown in FIG. 18, if the phase of the data DATA is advanced as compared to that of a clock CLK, a receiver 6L performs buffering of the data DATA and outputs it, when the receiver 6L becomes active by using the time the clock CLK rises to "H", as a trigger.

Thereafter, the signal of "H" obtained from the data output section D of the D-type flip-flop 81 is applied to the N channel gates of the transfer gates 58 and 56, with delay time ΔTB1 and ΔTB2 of the buffers 83 and 82 since the output of the receiver 6L rises to "H", respectively. By using the time the reverse clock RCLK rises to "H", as a trigger, the output of the receiver 6L i.e., "H", is latched by the driver 8L. In this case, since the delay time ΔTB2 of the buffer 83 is set to be greater than the delay time ΔTB1 of the buffer 82, there is no possibility that from the driver 8L, an erroneous signal is inputted to the input section of the receiver 6L.

By setting the test mode signal STM1 to "L" while preventing the influence of an internal logic 50 from appearing on the input of the driver 8L in the cycle of the next clock CLK, the driver 8L can output the data DATA of "H" to the data terminal 5.

On the other hand, where the phase of data DATA lags behind a clock CLK, the data DATA remains the state of "L" when the clock CLK rises to "H", and therefore, the "L" is latched by the receiver 6L and the "L" is then latched by the driver 8L.

Therefore, by using, as a reference, a timing located in the boundary of the timing condition under which the value latched by the driver 8L becomes "H" and the timing condition under which that value becomes "L", the LSI tester 100 may correct the timing value of the data to be described in its own test program and run a functional operation test vector for a device at the corrected timing.

As described above, the I/O buffer cell 101 of the ninth preferred embodiment has the phase comparison function and thus requires no special phase comparator 2 or 2A as disposed in the I/O buffer cells of the first to eighth preferred embodiments. This permits the simplification of circuit configuration.

While the invention has been shown and described in detail, the foregoing description is in all aspects illustrative and not restrictive. It is therefore understood that numerous modifications and variations can be devised without departing from the scope of the invention.

We claim:

1. A semiconductor device having an I/O buffer cell that receives first and second input signals and performs buffering of said first input signal so as to output a buffered internal input signal to an internal circuit, said I/O buffer cell including:

a phase comparing means for comparing a phase difference between said first input signal and said second input signal so as to output a phase comparison result; and an internal signal outputting means that performs buffering of said first input signal so as to output said buffered internal input signal, wherein the operation of said internal signal outputting means is controlled based on said second input signal.

2. The semiconductor device of claim 1, wherein said second input signal comprises a clock.

3. The semiconductor device of claim 1, wherein said I/O buffer cell further includes:

an external signal selecting means that receives a test mode signal, an internal output signal from said internal circuit, and said phase comparison result and, based on said test mode signal, outputs one of said phase comparison result and said internal output signal, as a selection signal for external output; and an external signal outputting means that performs buffering of said selection signal so as to output a buffered external output signal, the operation of said external signal outputting means being controlled based on said second input signal.

4. The semiconductor device of claim 1, wherein said second input signal comprises an out-of cell input signal and a clock; and said I/O buffer cell further includes a selection means for phase comparison that receives a test mode signal for phase comparison and, based on said test mode signal for phase comparison, outputs one of said out-of cell input signal and said clock to said phase comparing means.

5. The semiconductor device of claim 4, wherein said first input signal comprises a plurality of first input signals, and said I/O buffer cell comprises a plurality of I/O buffer cells provided so as to correspond to said plurality of first input signals respectively, each I/O buffer cell in said plurality of I/O buffer cells has said phase comparing means, said selection means for external signal, said selection means for phase comparison and said internal signal outputting means, receives the corresponding one of said plurality of first input signals, and is capable of outputting the corresponding first input signal as a cell output signal; and said plurality of I/O buffer cells are arranged in a predetermined order and receive said cell output signal of the I/O buffer cell of a previous stage as said out-of cell input signal.

6. The semiconductor device of claim 1, wherein said phase comparing means includes:

a logical gate that logically compares one of a match and mismatch between the value of said first input signal and the value of said second input signal to output a logical output signal; and a phase comparison result outputting means that outputs said logical output signal as said phase comparison result, during a predetermined sampling period.

7. The semiconductor device of claim 6, wherein said phase comparison result outputting means includes a sampling period detecting means that detects a period in the vicinity of a predetermined edge change of said second input signal as said sampling period, based on said second input signal.

8. The semiconductor device of claim 1, further comprising a phase comparison result outputting terminal capable of externally outputting said phase comparison result.

9. The semiconductor device of claim 8, wherein said phase comparing means includes:

a logical gate that logically compares one of a match and mismatch between the value of said first input signal and the value of said second input signal to output a logical output signal;

a sampling period detecting means that detects, as a sampling period, a period in the vicinity of a predetermined edge change of said second input signal, based on said second input signal;

a sampling means that latches, as a latch signal, a signal value of said logical output signal taken during said predetermined sampling period; and a current quantity adjusting means, which is placed on a signal path between a predetermined node and a fixed potential and, when supplying current to said predetermined node, changes the quantity of current flowing through said predetermined node, based on said latch signal, wherein said phase comparison result outputting terminal comprises said predetermined node, and said phase comparison result comprises the current flowing through said predetermined node.

10. The semiconductor device of claim 9, wherein said current quantity adjusting means comprises a CMOS inverter that receives a potential obtained from said predetermined node as a first power supply potential, said fixed potential as a second power supply potential, and said latch signal as an input signal.

11. The semiconductor device of claim 9, wherein said current quantity adjusting means comprises at least one NMOS transistor whose drain and source are connected to said predetermined node side and said fixed potential side, respectively, and whose gate receives said latch signal.

12. The semiconductor device of claim 8, wherein said phase comparing means includes:
   a logical gate that logically compares one of a match and mismatch between the value of said first signal and the value of said second input signal to output a logical output signal;
   a sampling period detecting means that detects a period in the vicinity of a predetermined edge change of said second input signal as a sampling period, based on said second input signal;
   a sampling means that latches, as a latch signal, a signal value of said logical output signal taken during said predetermined sampling period; and
   a counter that receives said latch signal and counts the number of a predetermined edge change of said latch signal to obtain a count result.

13. The semiconductor device of claim 12, wherein said count result comprises a count value of a predetermined number of bits; and
   said phase comparing means further includes a shift circuit capable of latching said count value and serially outputting said count value to said phase comparison result outputting terminal.

14. The semiconductor device of claim 12, wherein said count result comprises a count value of a predetermined number of bits;
   said phase comparison result outputting terminal comprises a predetermined number of output terminals corresponding to said count value of said predetermined number of bits; and
   said semiconductor device further comprises an output signal selecting means that receives said count value of said predetermined number of bits, externally outputs said count value from said predetermined number of output terminals when set in a first condition, and outputs another signal from said predetermined number of output terminals when set in a second condition.

15. A semiconductor device having an I/O buffer cell that receives first and second input signals and a test mode signal, and performs buffering of said first input signal so as to output a buffered internal input signal to an internal circuit, said I/O buffer cell comprising:
   an internal signal outputting means that performs buffering of a signal received at an input section by using a predetermined edge change of a first control signal, as a trigger, to output said buffered internal input signal, and latches said buffered internal input signal, the operation of said internal signal outputting means being controlled based on said first control signal;
   an external signal outputting means that performs buffering of a signal received at an input section by using said predetermined edge change of a second control signal, as a trigger, to output a buffered external output signal, and latches said buffered external output signal, the operation of said external signal outputting means being controlled based on said second control signal;
   a first transferring means being caused to be one of conducting and non-conducting based on a third control signal, and disposed on a signal path between an output section of said internal signal outputting means and the input section of said external signal outputting means;
   a second transferring means being caused to be one of conducting and non-conducting based on a fourth control signal, and disposed on a signal path between an output section of said external signal outputting means and the input section of said internal signal inputting means; and
   a control signal setting means that receives a test mode signal and said second input signal and, when said test mode signal indicates a phase comparison mode, sets said first control signal to said second input signal, said second control signal to a signal obtained by logically inverting said second input signal, said third control signal to a signal that indicates a conducting state with a first delay time from said predetermined edge change of said second input signal, and said fourth control signal to a signal that indicates a conducting state with a second delay time from said predetermined edge change of said second input signal, respectively, said second delay time being set to be greater than said first delay time.

* * * * *